United States Patent
Lee et al.

(10) Patent No.: US 10,878,901 B2
(45) Date of Patent: Dec. 29, 2020

(54) SEMICONDUCTOR DEVICES INCLUDING AUXILIARY BIT LINES

(71) Applicant: Samsung Electronics Co., Ltd., Suwon-si (KR)

(72) Inventors: Joonhee Lee, Seongnam-si (KR); Jiyoung Kim, Goyang-si (KR); Jintaek Park, Hwaseong-si (KR); Seong Soon Cho, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 16/368,916

(22) Filed: Mar. 29, 2019

(65) Prior Publication Data

US 2019/0228824 A1   Jul. 25, 2019

Related U.S. Application Data

(63) Continuation of application No. 15/681,910, filed on Aug. 21, 2017, now Pat. No. 10,276,237, which is a continuation of application No. 14/969,843, filed on Dec. 15, 2015, now Pat. No. 9,773,546.

(30) Foreign Application Priority Data

May 20, 2015   (KR) .................. 10-2015-0070648

(51) Int. Cl.
    *G11C 13/00*       (2006.01)
    *H01L 27/24*       (2006.01)

(52) U.S. Cl.
    CPC .......... *G11C 13/0026* (2013.01); *H01L 27/24* (2013.01); *H01L 27/2454* (2013.01); *H01L 27/2481* (2013.01); *G11C 13/0004* (2013.01); *G11C 13/0007* (2013.01); *G11C 2213/53* (2013.01); *G11C 2213/71* (2013.01); *G11C 2213/75* (2013.01)

(58) Field of Classification Search
    None
    See application file for complete search history.

(56) References Cited

U.S. PATENT DOCUMENTS

| 5,917,744 A | 6/1999 | Kirihata et al. |
|---|---|---|
| 5,966,315 A | 10/1999 | Muller et al. |
| 6,479,851 B1 | 11/2002 | Lee |

(Continued)

FOREIGN PATENT DOCUMENTS

| CN | 101189716 | 5/2008 |
|---|---|---|
| CN | 101390168 | 3/2009 |

(Continued)

OTHER PUBLICATIONS

Tanaka et al. "Bit Cost Scalable Technology with Punch and Plug Process for Ultra High Density Flash Memory" 2007 Symposium on VLSI Technology Digest of Technical Papers (pp. 14-15) (2007).

*Primary Examiner* — Long Pham
(74) *Attorney, Agent, or Firm* — Myers Bigel, P.A.

(57) ABSTRACT

Semiconductor devices are provided. A semiconductor device includes a stack of alternating gates and insulating layers. The semiconductor device includes a dummy cell region. The semiconductor device includes a plurality of bit lines and a plurality of auxiliary bit lines. Some of the plurality of auxiliary bit lines have different respective lengths. Related methods of forming semiconductor devices are also provided.

20 Claims, 39 Drawing Sheets

(56) References Cited

U.S. PATENT DOCUMENTS

| | | |
|---|---|---|
| 7,551,466 B2 | 6/2009 | Aritome |
| 7,989,880 B2 | 8/2011 | Wada et al. |
| 8,169,826 B2 | 5/2012 | Hishida et al. |
| 8,395,190 B2 | 3/2013 | Shim et al. |
| 8,605,478 B2 | 12/2013 | Mizuno et al. |
| 8,755,211 B2 | 6/2014 | Ozawa |
| 9,023,701 B1 | 5/2015 | Lee |
| 9,129,861 B2 | 9/2015 | Seol et al. |
| 9,553,101 B2 | 1/2017 | Kim et al. |
| 9,773,546 B2 * | 9/2017 | Lee .................... G11C 13/0026 |
| 10,276,237 B2 * | 4/2019 | Lee .................... G11C 13/0026 |
| 2007/0070678 A1 | 3/2007 | Kodama |
| 2007/0133328 A1 | 6/2007 | Koide |
| 2007/0295999 A1 | 12/2007 | Murakami |
| 2008/0225591 A1 | 9/2008 | Hosono et al. |
| 2009/0121271 A1 | 5/2009 | Son et al. |
| 2012/0032249 A1 | 2/2012 | Matsuda |
| 2013/0140672 A1 | 6/2013 | Sato et al. |
| 2014/0097484 A1 | 4/2014 | Seol et al. |
| 2014/0291804 A1 | 10/2014 | Kim et al. |
| 2014/0347928 A1 | 11/2014 | Lee |
| 2015/0054058 A1 | 2/2015 | Seol et al. |
| 2015/0302929 A1 * | 10/2015 | Maejima ............. H01L 27/1157 365/185.11 |
| 2019/0228824 A1 * | 7/2019 | Lee ......................... H01L 27/24 |

FOREIGN PATENT DOCUMENTS

| | | |
|---|---|---|
| CN | 102110690 | 6/2011 |
| JP | H08293588 | 11/1996 |
| JP | 2008227171 | 9/2008 |
| JP | 4609722 | 1/2011 |
| JP | 2011040706 | 2/2011 |
| JP | 4892215 | 3/2012 |
| JP | 2012174872 | 9/2012 |
| JP | 5305980 | 10/2013 |
| JP | 2014078714 | 5/2014 |
| JP | 2015012296 | 1/2015 |
| KR | 10-2003-0050959 | 6/2003 |
| KR | 10-0773161 | 11/2007 |
| KR | 10-0836768 | 6/2008 |
| KR | 10-0875059 | 12/2008 |
| KR | 10-2011-0015337 | 2/2011 |
| KR | 10-2014-0119525 | 10/2014 |

* cited by examiner

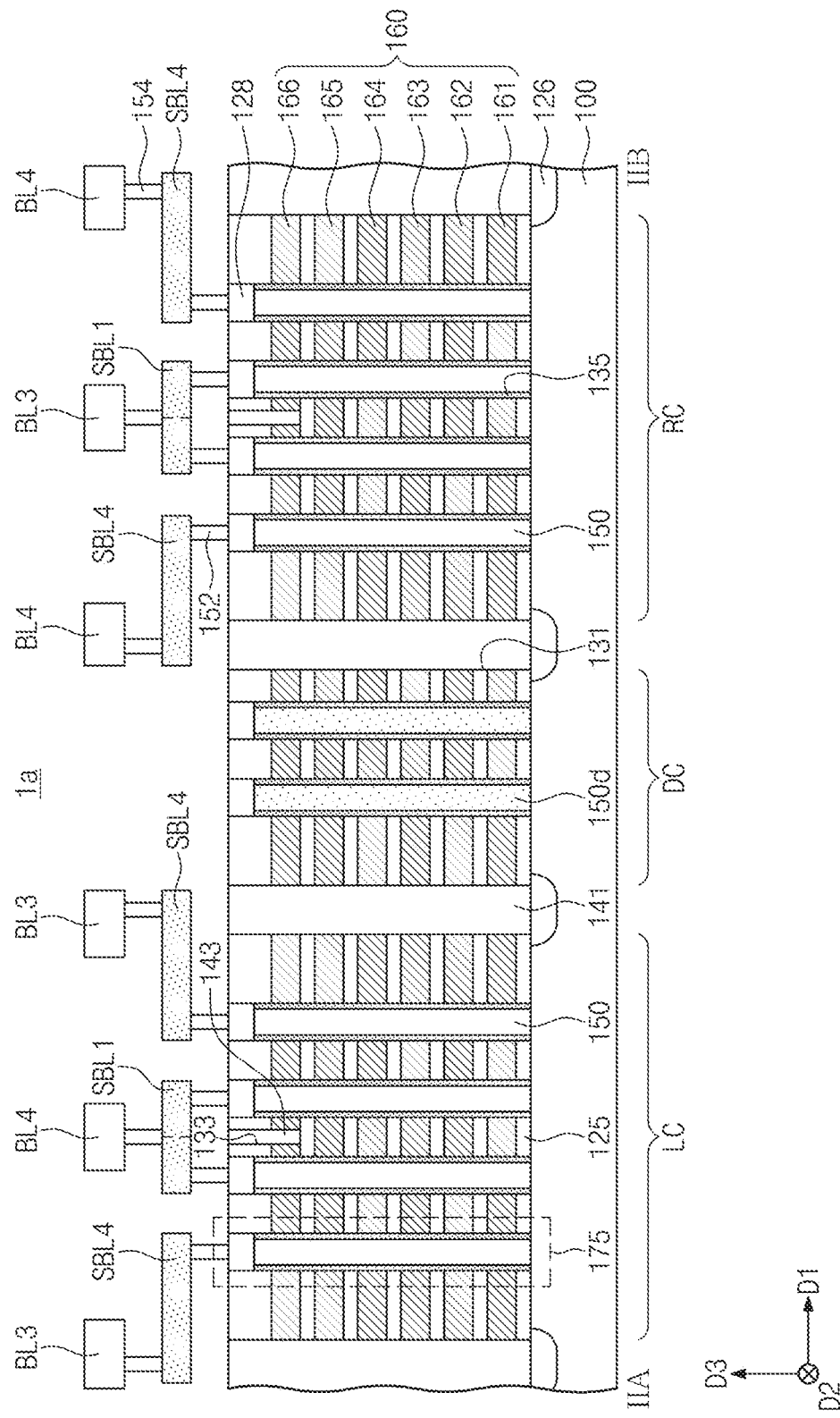

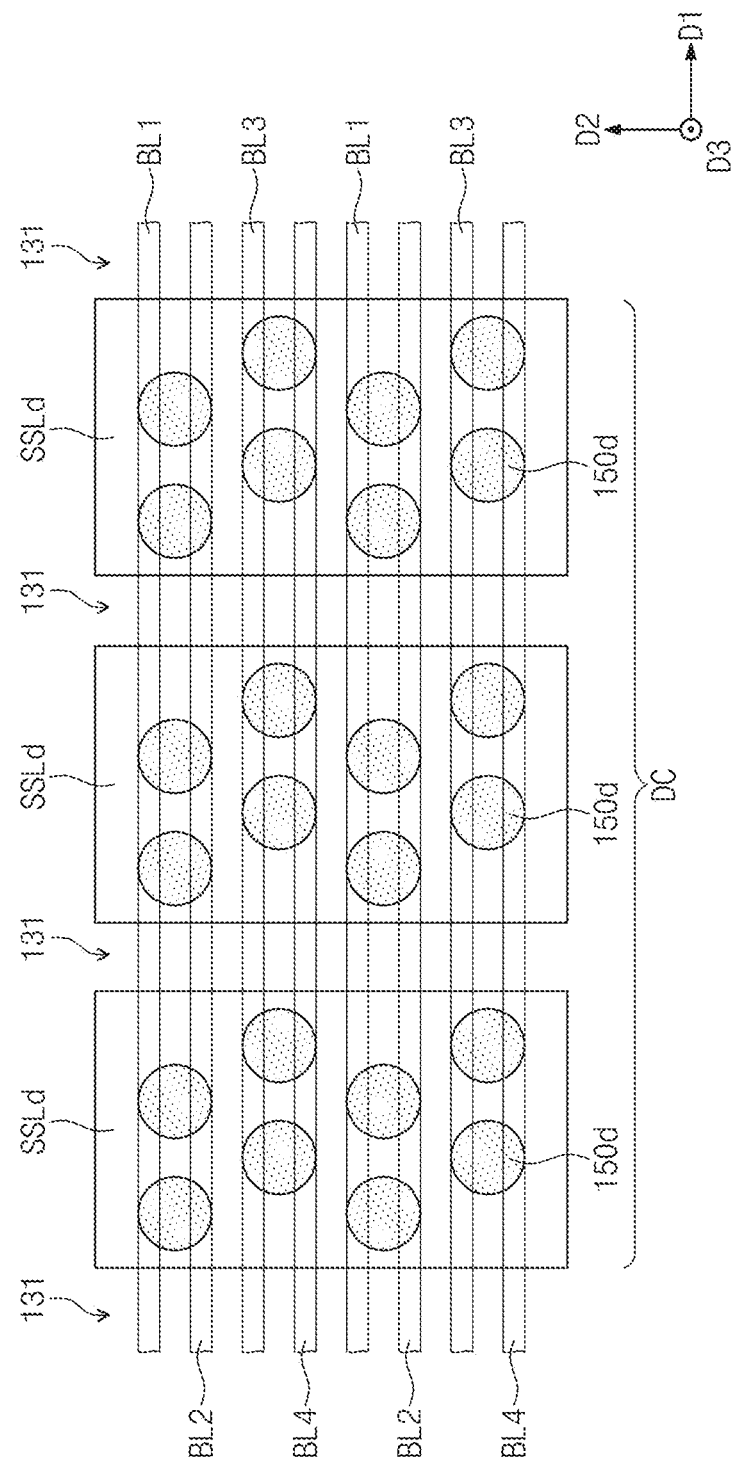

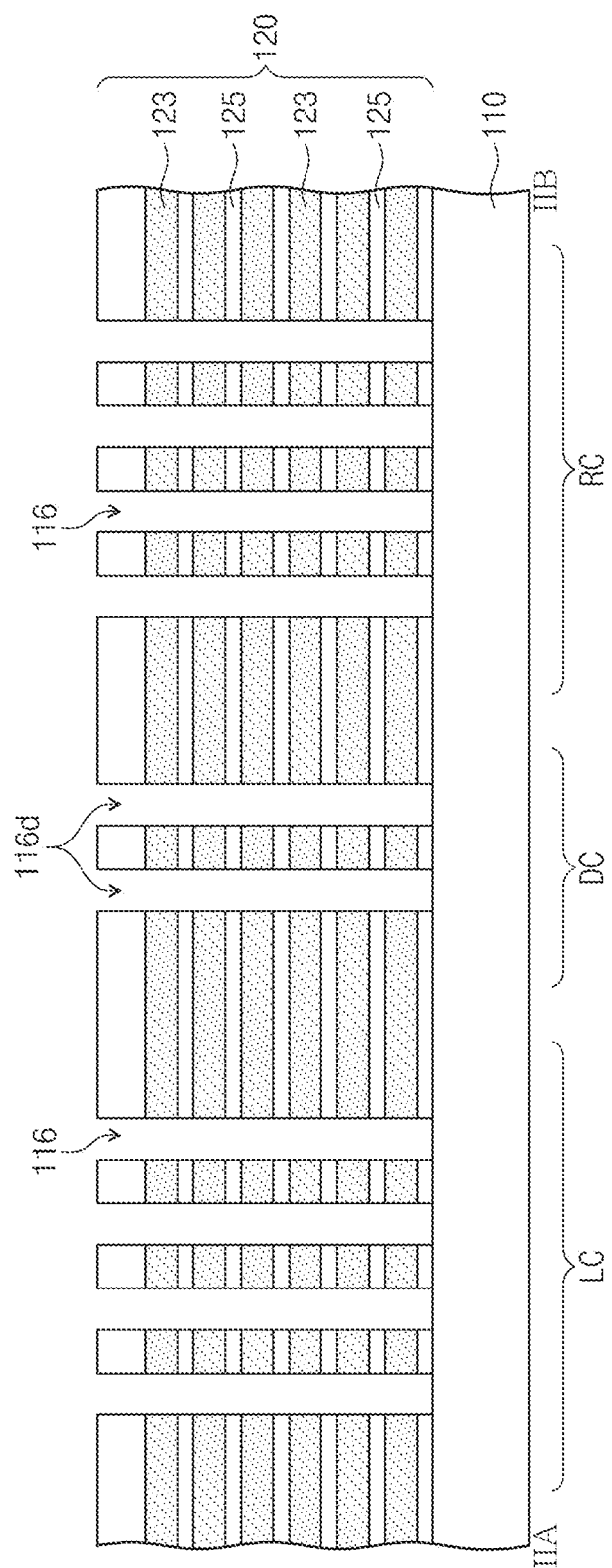

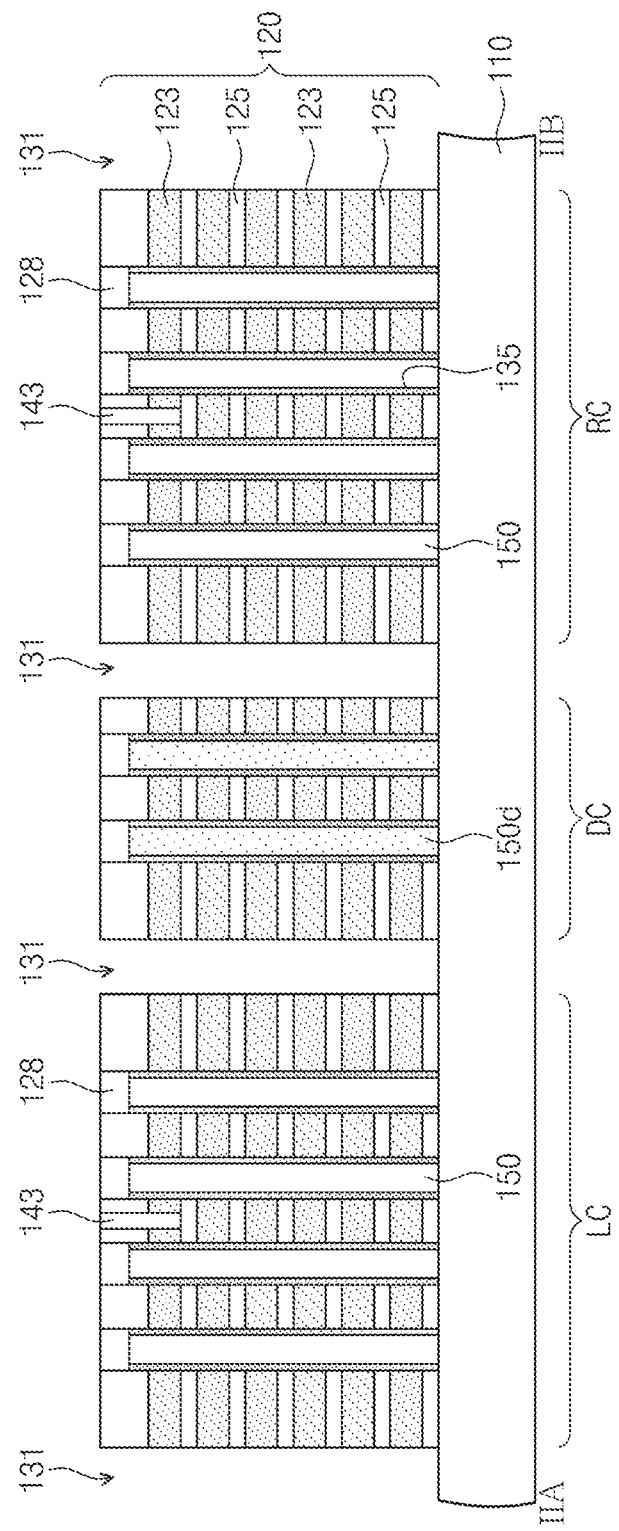

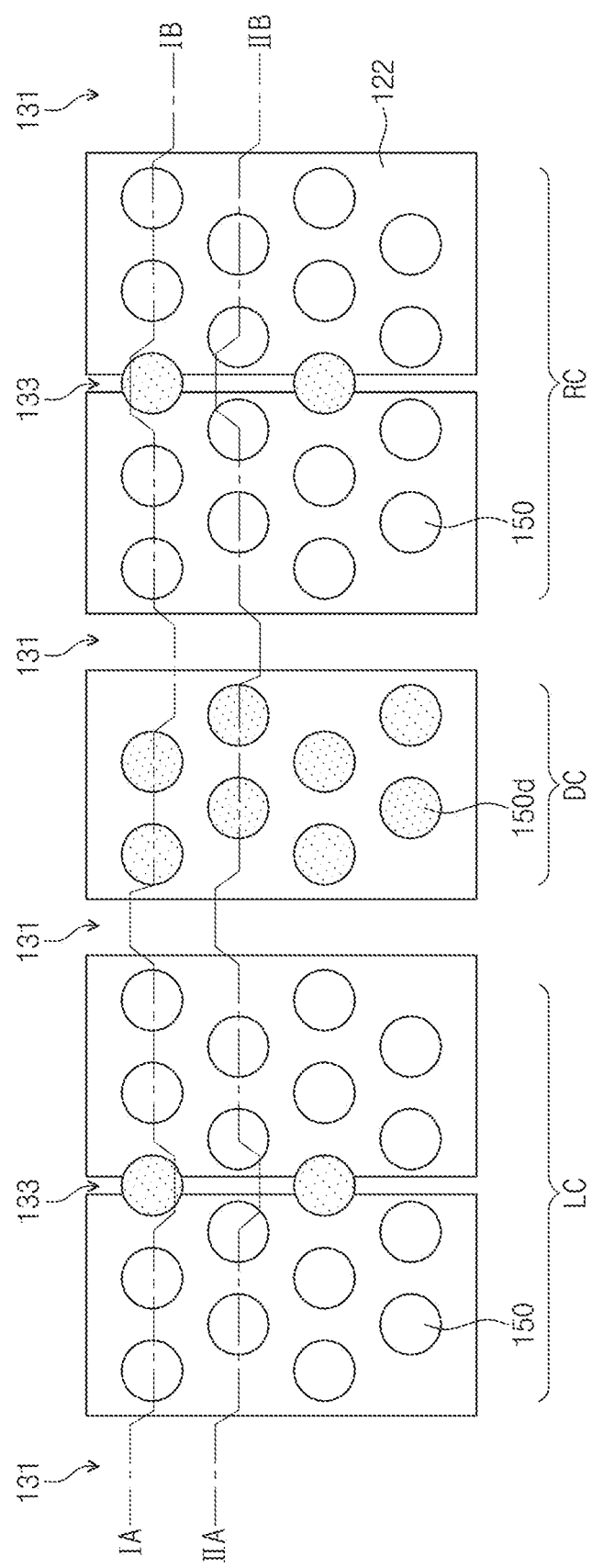

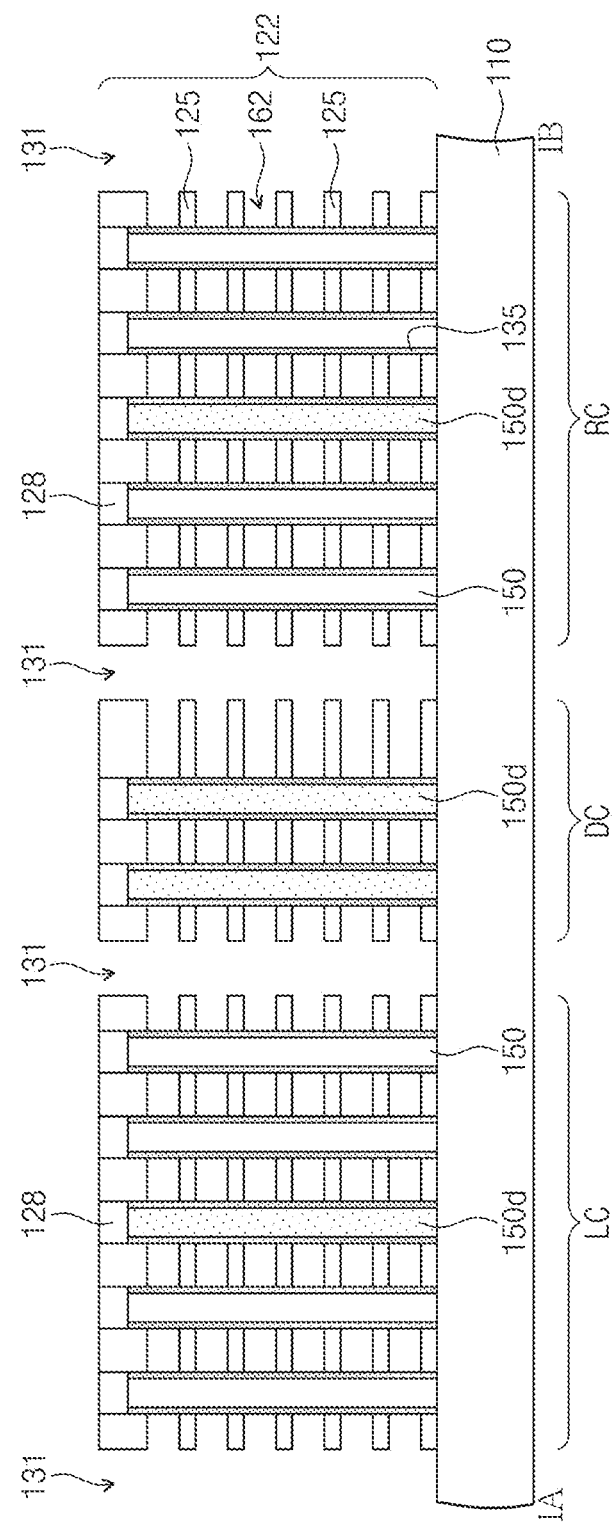

SEMICONDUCTOR DEVICES INCLUDING AUXILIARY BIT LINES

CROSS-REFERENCE TO RELATED APPLICATION

The present application is a continuation application of and claims priority from U.S. patent application Ser. No. 15/681,910, filed on Aug. 21, 2017, which is a continuation application of U.S. patent application Ser. No. 14/969,843, now U.S. Pat. No. 9,773,546, filed on Dec. 15, 2015, and claims priority under 35 U.S.C. § 119 to Korean Patent Application No. 10-2015-0070648, filed on May 20, 2015, in the Korean Intellectual Property Office, the entire contents of which are hereby incorporated herein by reference.

BACKGROUND

The present disclosure relates to semiconductor devices. To increase the integration density of nonvolatile semiconductor memory devices, research regarding a vertical-type NAND (VNAND) channel structure has been conducted. The VNAND string structure is described, for example, in "Bit Cost Scalable Technology with Punch and Plug Process for Ultra High Density Flash Memory" by H. Tanaka et al., VLSI Technology, 2007 IEEE Symposium on, pp. 14-15. Also, a vertical-type memory device with metal gates and a method of fabricating the same are disclosed in U.S. Patent Pub. No. 2009/0121271, entitled "Vertical-type non-volatile memory devices". The entire contents of these documents are incorporated by reference in the present patent application.

SUMMARY

According to various embodiments of present inventive concepts, a semiconductor device may include a stack of alternating gates and insulating layers. The semiconductor device may include a vertical channel in the stack. The semiconductor device may include a dummy cell region spaced apart from the vertical channel. The semiconductor device may include first through fourth auxiliary bit lines overlapping the stack. The first auxiliary bit line may be electrically connected to the vertical channel. The semiconductor device may include a first bit line overlapping and electrically connected to the first and second auxiliary bit lines. A first length of the first auxiliary bit line may either be longer or shorter than a second length of the second auxiliary bit line. Moreover, the semiconductor device may include a second bit line overlapping and electrically connected to the third and fourth auxiliary bit lines. A third length of the third auxiliary bit line may either be longer or shorter than a fourth length of the fourth auxiliary bit line. The first and second bit lines and the first through fourth auxiliary bit lines may be in first and second cell regions. The dummy cell region may be between the first and second cell regions that have the first and second bit lines and the first through fourth auxiliary bit lines therein.

In various embodiments, the semiconductor device may include a third bit line overlapping and electrically connected to the first and second auxiliary bit lines. Moreover, the semiconductor device may include a fourth bit line overlapping and electrically connected to the third and fourth auxiliary bit lines.

According to various embodiments, a first sum of the first and second lengths of the first and second auxiliary bit lines may be equal to or substantially equal to a second sum of the third and fourth lengths of the third and fourth auxiliary bit lines. In some embodiments, the semiconductor device may include first through fourth word line cut regions in the stack. The first cell region may include a first plurality of columns of cell strings, when viewed in a plan view, between the first and second word line cut regions. The second cell region may include a second plurality of columns of cell strings, when viewed in the plan view, between the third and fourth word line cut regions. The second and third word line cut regions may separate the first cell region from the second cell region. Moreover, the dummy cell region may be between the second and third word line cut regions that separate the first cell region from the second cell region.

In various embodiments, first shapes defined by the first through fourth auxiliary bit lines overlapping the first cell region of the stack may be symmetrical, in a plan view, with second shapes defined by the first through fourth auxiliary bit lines overlapping the second cell region of the stack. In some embodiments, first shapes defined by the first through fourth auxiliary bit lines overlapping the first cell region of the stack may be mirror images, in a plan view, of second shapes defined by the first through fourth auxiliary bit lines overlapping the second cell region of the stack.

According to various embodiments, an uppermost one of the gates may be divided into first and second string selection lines in each of the first and second cell regions. In some embodiments, the uppermost one of the gates may be divided into three or more string selection lines in each of the first and second cell regions. Moreover, in some embodiments, the second length of the second auxiliary bit line may be at least 50% longer than the first length of the first auxiliary bit line.

A semiconductor device, according to various embodiments, may include a stack of alternating gates and insulating layers. The semiconductor device may include a plurality of vertical channels in the stack. The semiconductor device may include a dummy cell region spaced apart from the plurality of vertical channels. The semiconductor device may include first and second pluralities of non-uniform-length auxiliary bit lines. Each of the non-uniform-length auxiliary bit lines may be electrically connected to a respective one of the plurality of vertical channels. Moreover, the semiconductor device may include first and second bit lines electrically connected to the first and second pluralities of non-uniform-length auxiliary bit lines, respectively. The first and second bit lines and the first and second pluralities of non-uniform-length auxiliary bit lines may be in first and second cell regions. The dummy cell region may be between the first and second cell regions that have the first and second bit lines and the first and second pluralities of non-uniform-length auxiliary bit lines therein.

In various embodiments, a first total length of the first plurality of non-uniform-length auxiliary bit lines may be equal to or substantially equal to a second total length of the second plurality of non-uniform-length auxiliary bit lines. In some embodiments, the first plurality of non-uniform-length auxiliary bit lines may include a first auxiliary bit line including a first length and a second auxiliary bit line including a second length that is at least 50% longer than the first length of the first auxiliary bit line. Moreover, in some embodiments, the plurality of vertical channels may be in a zig-zag pattern when viewed in a plan view.

A semiconductor device, according to various embodiments, may include a stack of alternating gates and insulating layers. The semiconductor device may include first through fourth word line cut regions in the stack. The first and second word line cut regions may define a first cell region therebetween. The third and fourth word line cut regions may define a second cell region therebetween. The second and third word line cut regions may separate the first cell region from the second cell region. The semiconductor device may include a dummy cell region between the second and third word line cut regions that separate the first cell region from the second cell region. The semiconductor device may include a plurality of bit lines extending from the first cell region to the second cell region. Moreover, the semiconductor device may include a plurality of auxiliary bit lines electrically connecting the plurality of bit lines to the first and second cell regions. Each of the plurality of bit lines may be electrically connected to different ones of the plurality of auxiliary bit lines that have different respective lengths.

In various embodiments, the first cell region may include a vertical channel in the stack. The plurality of auxiliary bit lines may include first through fourth auxiliary bit lines overlapping the stack. The first auxiliary bit line may be electrically connected to the vertical channel. The plurality of bit lines may include first and second bit lines. The first bit line may overlap and be electrically connected to the first and second auxiliary bit lines. A first length of the first auxiliary bit line may be shorter than a second length of the second auxiliary bit line. The second bit line may overlap and be electrically connected to the third and fourth auxiliary bit lines. A third length of the third auxiliary bit line may be shorter than a fourth length of the fourth auxiliary bit line.

According to various embodiments, the second length of the second auxiliary bit line may be at least 50% longer than the first length of the first auxiliary bit line. In some embodiments, the plurality of bit lines may include a third bit line overlapping and electrically connected to the first and second auxiliary bit lines. In some embodiments, the plurality of bit lines may include a fourth bit line overlapping and electrically connected to the third and fourth auxiliary bit lines.

In various embodiments, a first sum of the first and second lengths of the first and second auxiliary bit lines may be equal to or substantially equal to a second sum of the third and fourth lengths of the third and fourth auxiliary bit lines. In some embodiments, the plurality of bit lines may include a third bit line overlapping and electrically connected to the first and second auxiliary bit lines. In some embodiments, the plurality of bit lines may include a fourth bit line overlapping and electrically connected to the third and fourth auxiliary bit lines.

According to various embodiments, first shapes defined by the first through fourth auxiliary bit lines overlapping the first cell region of the stack may be symmetrical, in a plan view, with second shapes defined by the first through fourth auxiliary bit lines overlapping the second cell region of the stack. In some embodiments, the first cell region may include a first plurality of columns of cell strings, when viewed in a plan view, between the first and second word line cut regions. The second cell region may include a second plurality of columns of cell strings, when viewed in the plan view, in between the third and fourth word line cut regions. Moreover, the first plurality of columns of cell strings may include respective channels that are in a zig-zag pattern when viewed in the plan view.

In various embodiments, the first cell region may include a first plurality of columns of cell strings, when viewed in a plan view, between the first and second word line cut regions. The second cell region may include a second plurality of columns of cell strings, when viewed in the plan view, in between the third and fourth word line cut regions. Moreover, the first plurality of columns of cell strings may include at least four columns of cell strings.

According to various embodiments, the first cell region may include a first selection line cut region between the first and second word line cut regions. In some embodiments, the second cell region may include a second selection line cut region between the third and fourth word line cut regions. Moreover, in some embodiments, the dummy cell region may include one of a plurality of dummy cell regions that are between the second and third word line cut regions that separate the first cell region from the second cell region.

A method of forming a semiconductor device, according to various embodiments, may include forming a channel hole in a first region in a stack of alternating insulating layers and sacrificial layers. A dummy region may be between the first region and a second region. The method may include forming a vertical channel in the channel hole. The method may include removing the sacrificial layers from the stack to form recesses adjacent the vertical channel. The method may include forming gates in the recesses. The method may include forming first through fourth auxiliary bit lines overlapping the stack. The first auxiliary bit line may be electrically connected to the vertical channel. The method may include forming a first bit line overlapping and electrically connected to the first and second auxiliary bit lines. A first length of the first auxiliary bit line may either be longer or shorter than a second length of the second auxiliary bit line. Moreover, the method may include forming a second bit line overlapping and electrically connected to the third and fourth auxiliary bit lines. A third length of the third auxiliary bit line may either be longer or shorter than a fourth length of the fourth auxiliary bit line. The first and second regions that have the dummy region therebetween may include the first and second bit lines and the first through fourth auxiliary bit lines.

A method of forming a semiconductor device, according to various embodiments, may include forming a plurality of channel holes in first and second regions in a stack of alternating insulating layers and sacrificial layers. A dummy region may be between the first and second regions. The method may include forming a plurality of vertical channels in respective ones of the plurality of channel holes. The method may include removing the sacrificial layers from the stack to form recesses adjacent the plurality of vertical channels. The method may include forming gates in the recesses. The method may include forming first and second pluralities of non-uniform-length auxiliary bit lines. Each of the non-uniform-length auxiliary bit lines may be electrically connected to a respective one of the plurality of vertical channels. Moreover, the method may include forming first and second bit lines electrically connected to the first and second pluralities of non-uniform-length auxiliary bit lines, respectively. The first and second regions that have the dummy region therebetween may include the first and second bit lines and the first and second pluralities of non-uniform-length auxiliary bit lines.

A method of forming a semiconductor device, according to various embodiments, may include forming a plurality of channel holes in a stack of alternating insulating layers and sacrificial layers. The method may include forming a plurality of vertical channels in respective ones of the plurality of channel holes. The method may include forming a plurality of word line cut regions in the stack, to define first and second cell regions and a dummy cell region between the first and second cell regions. The first cell region may be between first and second ones of the plurality of word line cut regions. The second cell region may be between third and fourth ones of the plurality of word line cut regions. The second and third word line cut regions may separate the first cell region from the second cell region. The dummy cell region may be between the second and third word line cut regions that separate the first cell region from the second cell region. The method may include removing the sacrificial layers from the stack to form recesses adjacent the plurality of vertical channels. The method may include forming gates in the recesses. The method may include forming first and second pluralities of non-uniform-length auxiliary bit lines. Each of the non-uniform-length auxiliary bit lines may be electrically connected to a respective one of the plurality of vertical channels. Moreover, the method may include forming first and second bit lines electrically connected to the first and second pluralities of non-uniform-length auxiliary bit lines, respectively.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIG. 2C is a sectional view taken along line IIA-IIB of FIG. 2A

FIGS. 3B-3F are plan views illustrating modifications of FIG. 3A.

FIGS. 4A through 9A are plan views illustrating a method of fabricating a semiconductor memory device according to example embodiments of present inventive concepts.

FIGS. 4B through 9B are sectional views taken along line IA-IB of FIGS. 4A through 9A, respectively.

FIGS. 4C through 9C are sectional views taken along line IIA-IIB of FIGS. 4A through 9A, respectively.

Figure 1A:
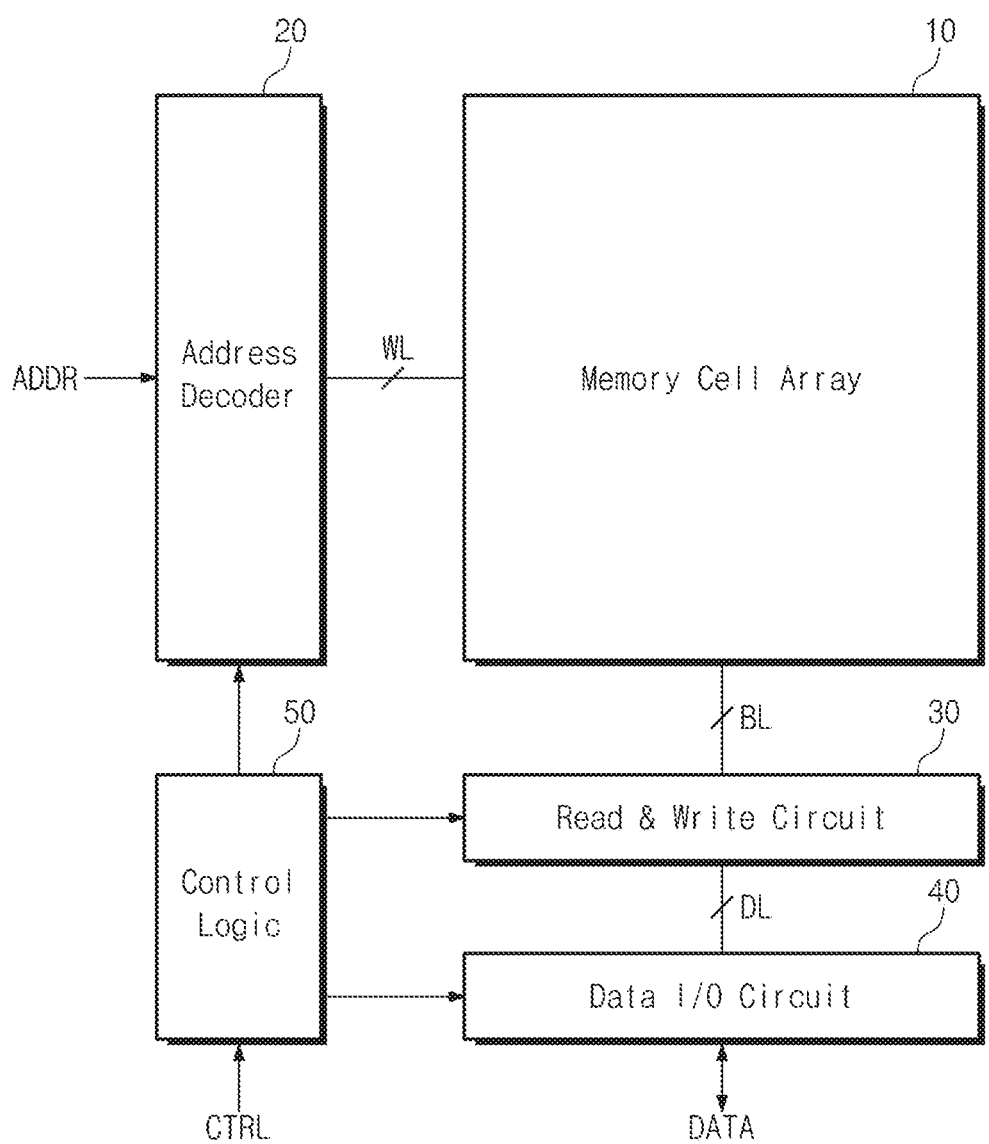
FIG. 1A is a block diagram illustrating a semiconductor memory device according to example embodiments of present inventive concepts.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments are described below with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete, and will convey the scope of the disclosure to those skilled in the art. In the drawings, the sizes and relative sizes of layers and regions may be exaggerated for clarity. Like reference numbers refer to like elements throughout the description.

The terminology used herein is for the purpose of describing particular embodiments only and is not intended to be limiting of the embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of the stated features, steps, operations, elements, and/or components, but do not preclude the presence or addition of one or more other features, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein the term "and/or" includes any and all combinations of one or more of the associated listed items.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein may be interpreted accordingly.

Example embodiments of present inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of present inventive concepts should not be construed as limited to the particular shapes of regions illustrated herein but are to include deviations in shapes that result, for example, from manufacturing. Accordingly, the regions illustrated in the figures are schematic in nature and their shapes are not intended to illustrate the actual shape of a region of a device and are not intended to limit the scope of example embodiments.

It will be understood that although the terms "first," "second," etc. may be used herein to describe various elements, these elements should not be limited by these terms. These terms are only used to distinguish one element from another. Thus, a "first" element could be termed a "second" element without departing from the teachings of the present embodiments.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

[Block Diagram]

Figure 1B:
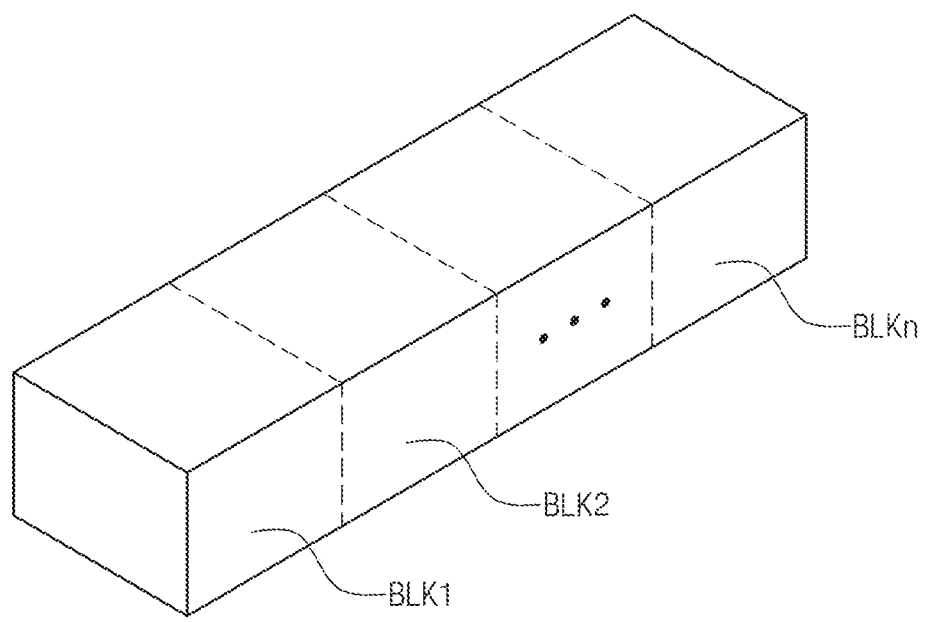
FIG. 1B is a schematic diagram illustrating an example of a memory cell array of FIG. 1A.

FIG. 1A is a block diagram illustrating a semiconductor memory device according to example embodiments of present inventive concepts. FIG. 1B is a schematic diagram illustrating an example of a memory cell array of FIG. 1A.

Referring to FIG. 1A, a semiconductor memory device 1 may include a memory cell array 10, an address decoder 20, a read/write circuit 30, a data input/output circuit 40, and a control logic 50.

The memory cell array 10 may be connected to the address decoder 20 through word lines WL and may be connected to the read/write circuit 30 through bit lines BL. The memory cell array 10 may include a plurality of memory cells. For example, the memory cell array 10 may be configured to store one or more bits in each cell.

The address decoder 20 may be connected to the memory cell array 10 through the word lines WL. The address decoder 20 may be configured to operate in response to the control of the control logic 50. The address decoder 20 may receive an address ADDR from the outside (e.g., from a device/component external to the semiconductor memory device 1). The address decoder 20 decodes a row address, which is included in the received address ADDR, to select a corresponding one of the word lines WL. The address decoder 20 may also be configured to decode a column address, which is included in the address ADDR, and transfer the decoded column address to the read/write circuit 30. For example, the address decoder 20 may include a row decoder, a column decoder, and an address buffer.

The read/write circuit 30 may be connected to the memory cell array 10 through the bit line BL and may be connected to the data input/output circuit 40 through the data lines DL. The read/write circuit 30 may operate in response to the control of the control logic 50. The read/write circuit 30 may be configured to receive the column address decoded by the address decoder 20. The read/write circuit 30 may select one of the bit lines BL, based on the decoded column address. The read/write circuit 30 may be configured to receive data from the data input/output circuit 40 and write the received data in the memory cell array 10. The read/write circuit 30 may be configured to read data from the memory cell array 10 and transfer the read data to the data input/output circuit 40. Furthermore, the read/write circuit 30 may be configured to read data from a first storage region of the memory cell array 10 and write the read data in a second storage region of the memory cell array 10. For example, the read/write circuit 30 may be configured to perform a copyback operation.

The read/write circuit 30 may be configured to include elements, such as a page buffer (or a page register) and a column selection circuit. As another example, the read/write circuit 30 may be configured to include elements, such as a sense amplifier, a write driver, and a column selection circuit.

The data input/output circuit 40 may be connected to the read/write circuit 30 through the data lines DL. The data input/output circuit 40 may be configured to operate in response to the control of the control logic 50. The data input/output circuit 40 may also be configured to exchange data DATA with the outside (e.g., with a device/component external to the semiconductor memory device 1). The data input/output circuit 40 may be configured to transfer the data DATA, which is provided from the outside, to the read/write circuit 30 through the data lines DL. The data input/output circuit 40 may be configured to output the data DATA, which is provided from the read/write circuit 30, to the outside through the data lines DL. For example, the data input/output circuit 40 may include an element such as a data buffer.

The control logic 50 may be connected to the address decoder 20, the read/write circuit 30, and the data input/output circuit 40. The control logic 50 may be configured to control the operation of the semiconductor memory device. The control logic 50 may operate in response to a control signal CTRL transferred from the outside (e.g., from a device/component external to the semiconductor memory device 1).

Referring to FIG. 1B, the memory cell array 10 may include a plurality of memory blocks BLK1 to BLKn. Each of the memory blocks BLK1 to BLKn may be provided to have a three-dimensional or vertical structure. For example, each of the memory blocks BLK1 to BLKn may include a plurality of cell strings, each of which is extended along one of intersecting directions. Some examples of the semiconductor memory device 1 will be described below.

Example Embodiments

Figure 2A:
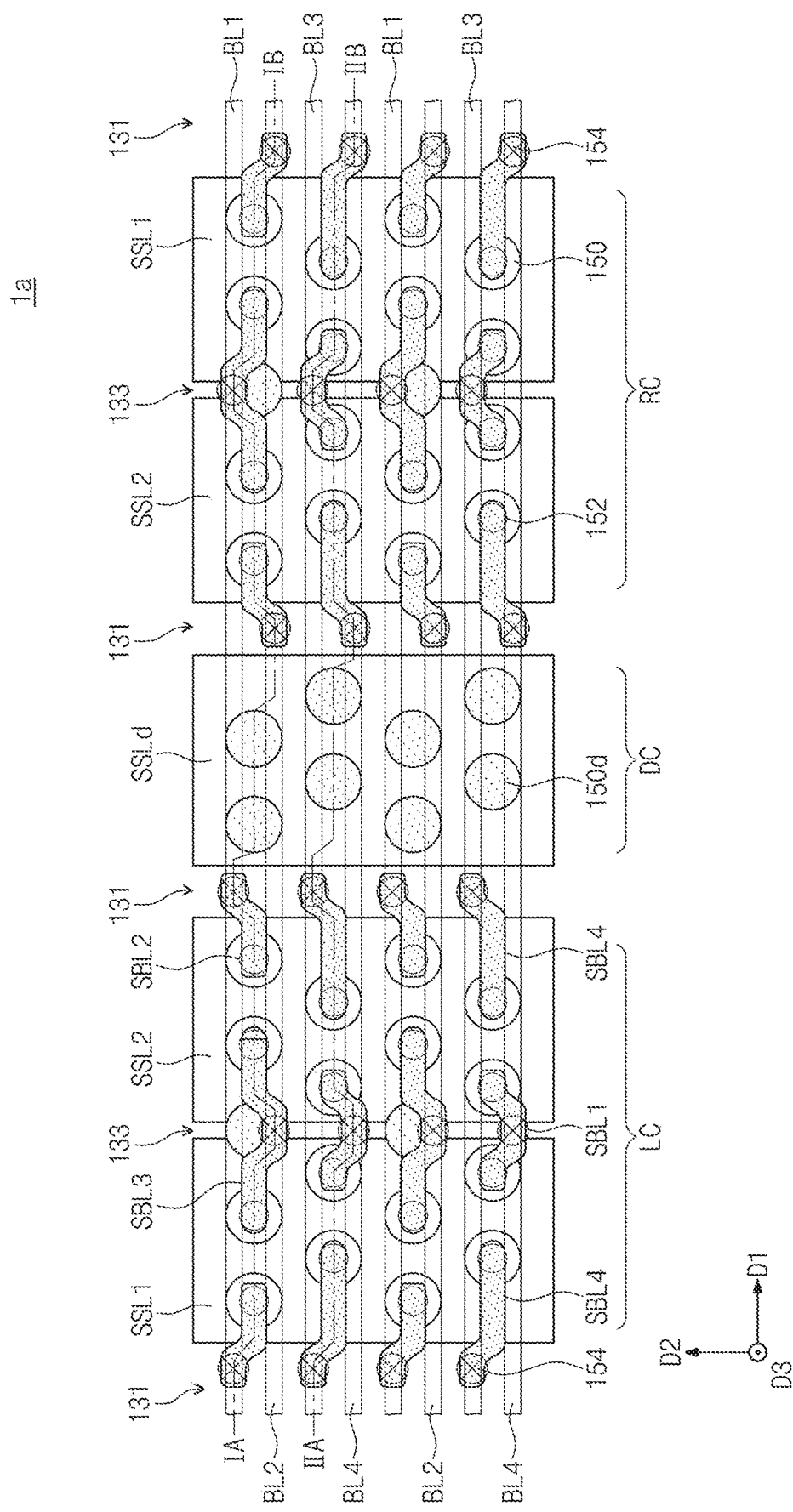
FIG. 2A is a plan view illustrating a semiconductor memory device according to example embodiments of present inventive concepts.
Figure 2B:
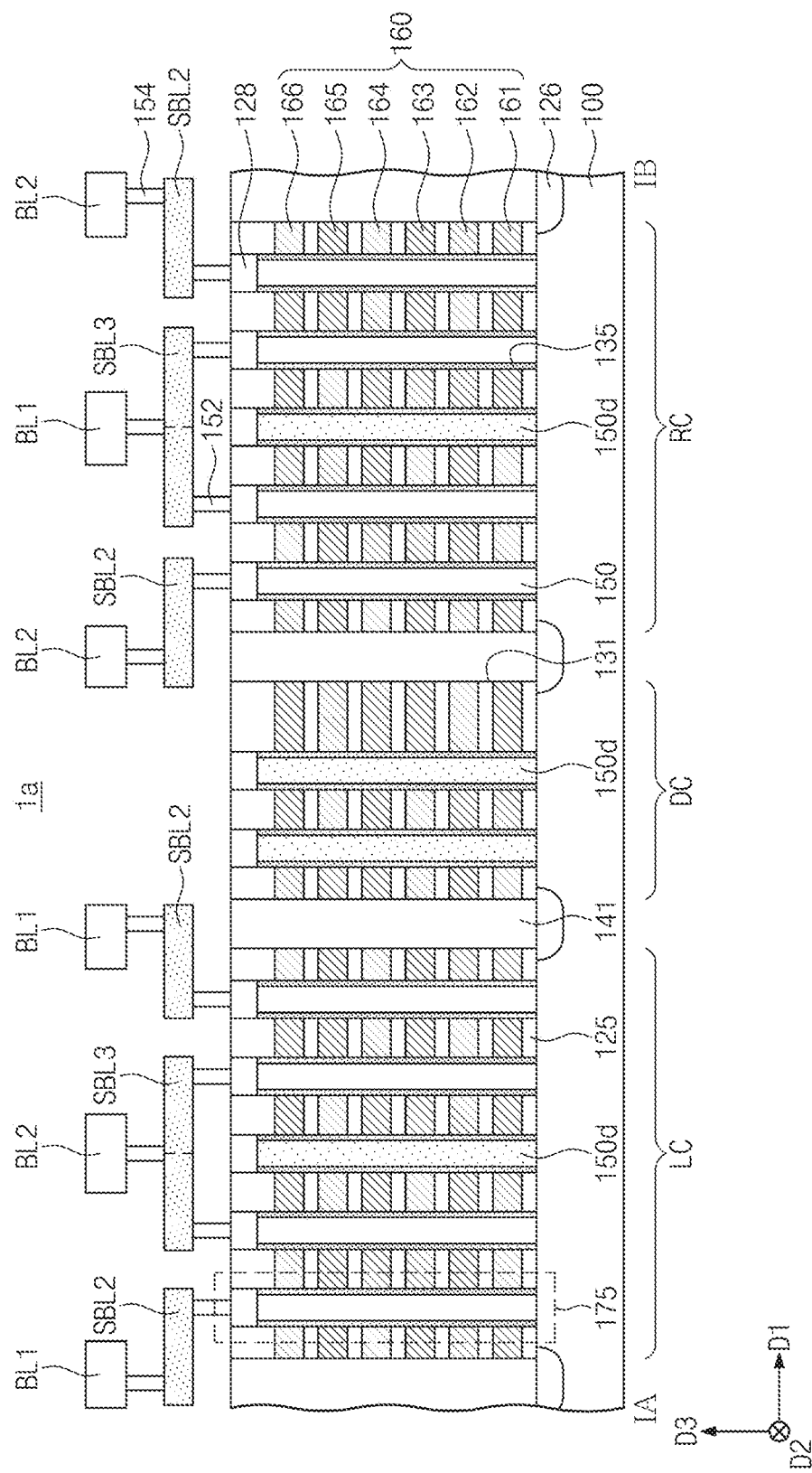
FIG. 2B is a sectional view taken along line IA-IB of FIG. 2A.
Figure 3A:
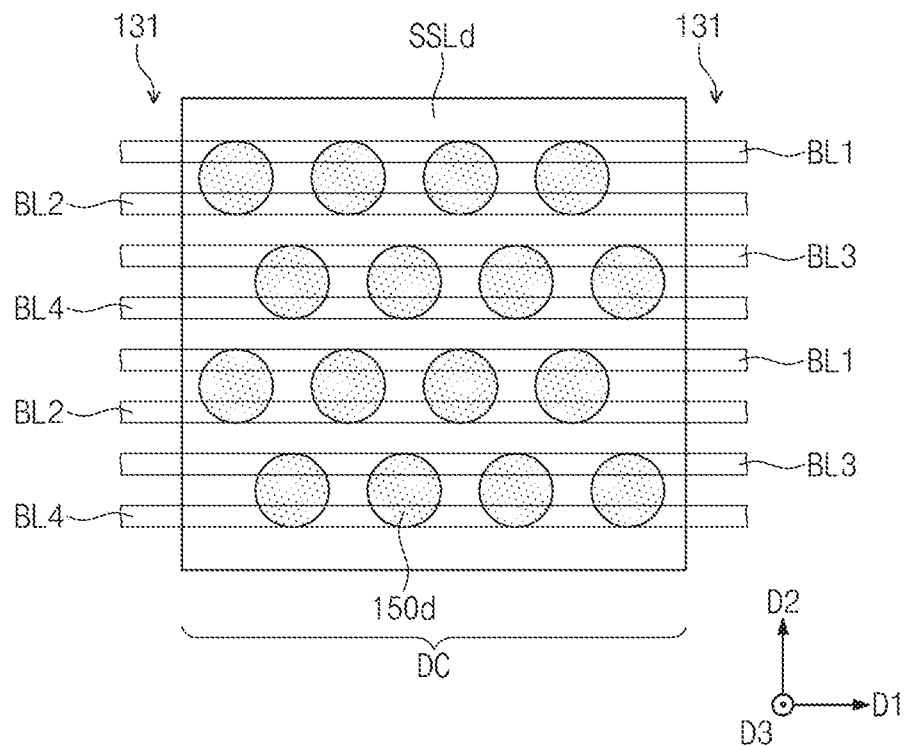
FIG. 3A is a plan view illustrating a dummy cell region of the semiconductor memory device of FIG. 2A.

FIG. 2A is a plan view illustrating a semiconductor memory device according to example embodiments of present inventive concepts. FIG. 2B is a sectional view taken along line IA-IB of FIG. 2A. FIG. 2C is a sectional view taken along line IIA-IIB of FIG. 2A. FIG. 3A is a plan view illustrating a dummy cell region of the semiconductor memory device of FIG. 2A. FIGS. 3B-3F are plan views illustrating modifications of FIG. 3A.

Referring to FIGS. 2A, 2B, and 2C, a semiconductor memory device 1a may include a gate stack 160 on a semiconductor substrate 110, vertical channels 150 penetrating the gate stack 160, and bit lines BL1-BL4 electrically connected to the vertical channels 150. Furthermore, the semiconductor memory device 1a may be configured to include a memory layer 135 extending along the vertical channel 150. As an example, the memory layer 135 may include a nitride layer interposed between oxide layers. As another example, the memory layer 135 may include a variable resistance layer (e.g., of chalcogen compounds or transition metal oxides).

The bit lines BL1-BL4 may extend along a first direction D1 parallel to the semiconductor substrate 110 and may be spaced apart from each other in a second direction D2 crossing the first direction D1 and parallel to the semiconductor substrate 110. The vertical channel 150 may extend along a third direction D3 perpendicular to the semiconductor substrate 110.

The gate stack 160 may include a plurality of cell strings 175 extending in the second direction D2, and here, the cell string 175 may include a plurality of gates 161-166, which are vertically stacked along the vertical channel 150 and are spaced apart from each other by insulating layers 125. The gates 161-166 may include at least one first gate 161, which is provided adjacent to the semiconductor substrate 110 to serve as a ground selection line GSL, at least one sixth gate 166, which is provided adjacent to the bit lines BL1-BL4 to serve as a string selection line SSL, and second to fifth gates 162-165, which are provided between the ground selection line GSL and the string selection line SSL to serve as the word lines WL. In some embodiments, an example in which the gates 161-166 are provided at six different levels will be described to provide understanding of present inventive concepts, but example embodiments of present inventive concepts may not be limited thereto. For example, the layer number of the gates may be larger than six.

The semiconductor memory device 1a may further include a word-line cut region 131 separating the gate stacks 160 from each other in the first direction D1. The word-line cut region 131 may be a trench-shaped structure extending in the second direction D2 and may be filled with an insulating layer 141. A common source 126 may be provided in a portion of the semiconductor substrate 110 positioned below the insulating layer 141 to serve as a common source line (CSL). The common source 126 may have a conductivity type (e.g., n-type) that is different from a conductivity type (e.g., p-type) of the semiconductor substrate 110. A drain 128 may be provided on or in a top portion of the vertical channel 150 and may have the same conductivity type (e.g., p-type) as that of the common source 126.

The vertical channels 150 may have respective bottom ends, which are electrically connected to the semiconductor ends, and respective top ends, which are electrically connected to the bit lines BL1-BL4. In some embodiments, auxiliary lines SBL1-SBL4 may be further provided between the vertical channels 150 and the bit lines BL1-BL4. The auxiliary lines SBL1-SBL4 may be electrically connected to the vertical channels 150 through lower contacts 152 and may be electrically connected to the bit lines BL1-BL4 through upper contacts 154. Moreover, as used herein, the terms "auxiliary line," "auxiliary bit line," and "SBL" may refer to a sub-interconnection. For example, an auxiliary bit line SBL may be an interconnection/sub-interconnection that electrically couples a cell string to a bit line BL. In some embodiments, the auxiliary bit line SBL and the bit line BL may include the same material (such as tungsten).

The semiconductor memory device 1a may include a first cell region LC and a second cell region RC which are spaced apart from each other in the first direction D1. A dummy cell region DC may be further provided between the first and second cell regions LC and RC. The dummy cell region DC may help to control capacitance in semiconductor devices according to some embodiments of present inventive concepts. As another example, the dummy cell region DC may not be provided (e.g., may be omitted), and the first and second cell regions LC and RC may be separated from each other by the word-line cut region 131. Hereinafter, for convenience in description, the first cell region LC may be referred to as a "left cell region" and the second cell region RC may be referred to as a "right cell region".

According to some embodiments, the semiconductor memory device 1a may further include at least one dummy channel 150d having substantially the same structure as the vertical channel 150. For example, each of the left and right cell regions LC and RC may include at least one dummy channel 150d. The semiconductor memory device 1a may be configured to include a plurality of cell arrays 190, which are repeatedly disposed, and each of which has nine channels (e.g., eight vertical channels 150 electrically connected to the bit lines BL1-BL4 and one dummy channel 150d).

In each of the left and right cell regions LC and RC, the sixth gate 166 may be divided into at least two portions. For example, the sixth gate 166 may be divided into a first string selection line SSL1 and a second string selection line SSL2, which are separated from each other in the first direction D1 by a selection-line cut region 133 extending parallel to the second direction D2 and having a trench shape. The selection-line cut region 133 may be filled with an insulating layer 143. A plurality of dummy channels 150d may be arranged on the selection-line cut region 133 to collectively form a column along the second direction D2. In example embodiments, the selection-line cut region 133 may be provided to have a width or space that is smaller than that of the word-line cut region 131, when measured in the first direction D1.

The vertical channels 150 and the dummy channels 150d may be regularly arranged in each of the left and right cell regions LC and RC. As an example, the vertical channels 150 and the dummy channels 150d may be disposed to form a zigzag arrangement along the second direction D2, and such a zigzag arrangement may be repeated in the first direction D1. The zigzag (e.g., non-linear) arrangement of the vertical channels 150 may allow the semiconductor memory device 1a to have an increased density, compared with the case of arranging the vertical channels in a line. Furthermore, this may lead to an increase in the number of the vertical channels 150 connected to the string selection lines SSL1 and SSL2 and consequently an increase in page size or depth of the semiconductor memory device 1a. As a result, it is possible to increase a data size that can be processed at the same time in reading or writing operations and, consequently, to improve performance and/or operation speed of the semiconductor memory device 1a.

As an example, a most (e.g., closest/directly) adjacent pair of the vertical channels 150 in the second direction D2 (e.g., as illustrated in FIG. 2A) may be spaced apart from each other by a distance that is about twice a pitch (hereinafter, bit line pitch) of the bit lines BL1-BL4. Similarly, a most adjacent pair of the vertical channel 150 and the dummy channel 150d in the second direction D2 may be spaced apart from each other by a distance that is about twice the distance of the bit line pitch. The vertical channels 150 and the dummy channels 150d, which are adjacent to each other in the first direction D1, may be arranged in a line and may be spaced apart and equidistant from each other (for example, by about twice the bit line pitch or by a distance different therefrom).

The dummy cell region DC may include, or not, the dummy channel 150d. As an example, the dummy cell region DC may include the dummy channels 150d arranged in a zigzag manner along the second direction D2 and spaced equidistant from each other along the first direction D1, as shown in FIG. 2A. The sixth gate 166 in the dummy cell region DC may serve as the dummy string selection line SSLd. Referring to FIG. 2B, the layout may be repeatedly arranged. For example, the auxiliary line SBL2 may be repeated in the left cell region LC. Moreover, any of the auxiliary lines SBL1-SBL4 may be repeatedly arranged and the repeated interconnection(s) may be labeled with the same respective numeral(s) and/or letter(s).

In the left and right cell regions LC and RC, the vertical and dummy channels 150 and 150d may be regularly arranged to form a cell array with regularity in pattern arrangement. Here, the dummy cell region DC may be provided at a center of the cell array to break the regularity in pattern arrangement, but since the dummy channels 150d arranged in a zigzag manner are provided in the dummy cell region DC, it may be possible to revive the regularity in pattern arrangement and thereby to suppress or prevent a variation in electric characteristics (e.g., capacitance) of the vertical channel 150, which may occur when the regularity in pattern arrangement is broken.

Figure 3B:
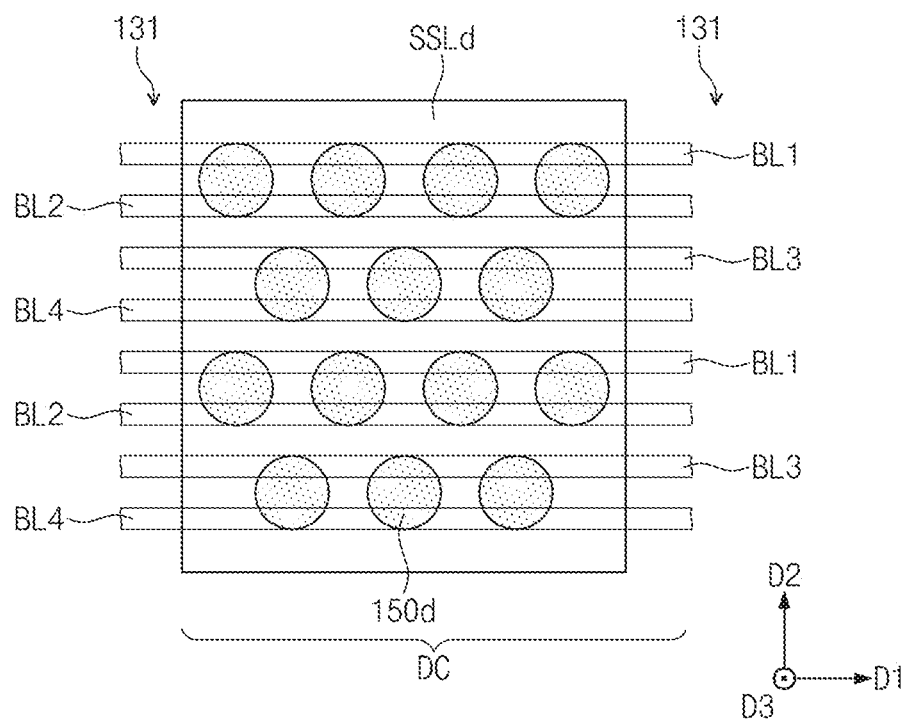

The size of the dummy cell region DC may be arbitrary (e.g., may vary). For example, the dummy cell region DC may extend in/toward at least the first direction D1 as shown in FIG. 3A. The number (e.g., four) of dummy channels 150d arranged on each odd row may be the same as the number (e.g., four) of the dummy channels 150d arranged on each even row. Alternatively, as shown in FIG. 3B, the number (e.g., four) of dummy channels 150d arranged on each odd row may be different from the number (e.g., three) of the dummy channels 150d arranged on each even row.

Figure 3C:
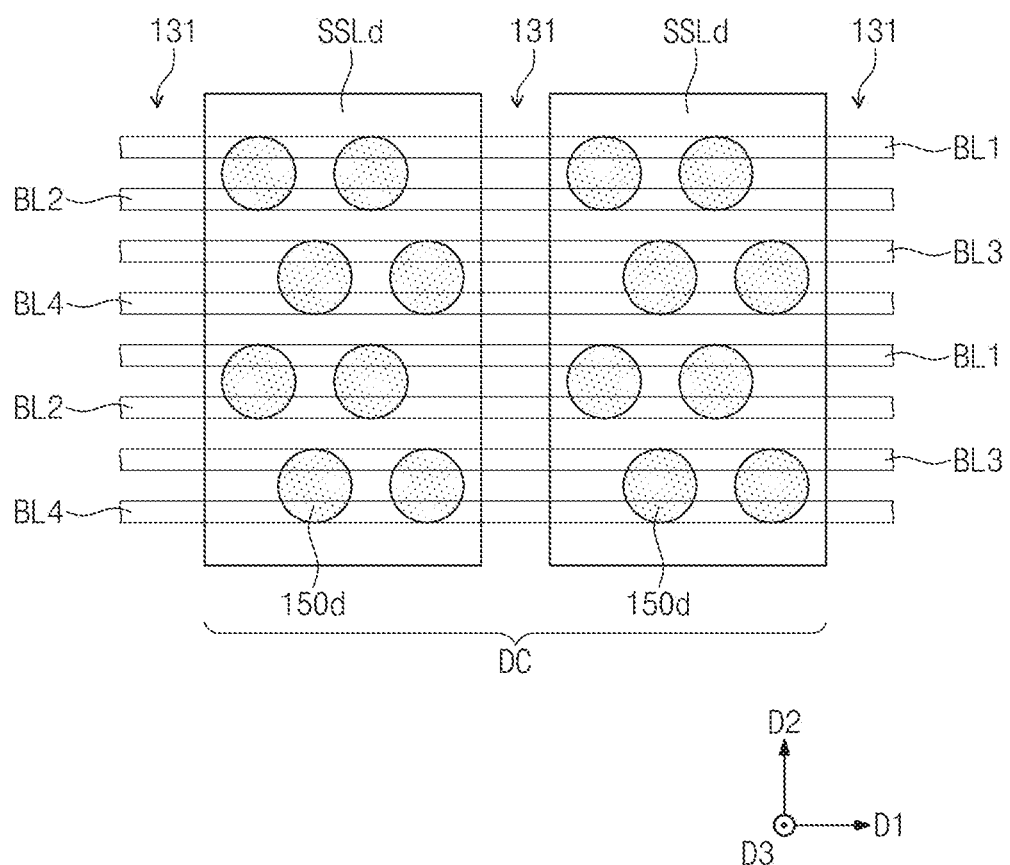

As another example, as shown in FIG. 3C, the dummy cell region DC may be divided into two portions, which are separated from each other in the first direction D1 by the word-line cut region 131, and here, the word-line cut region 131 may be optionally provided to extend along the second direction D2. Alternatively, as shown in FIG. 3D, the dummy cell region DC may be divided into three portions which are separated from each other in the first direction D1 by two word-line cut regions 131 which are optionally provided. As such, the dummy cell region DC may be divided into N+1 portions by N word-line cut regions 131 which are optionally provided in the dummy cell region DC.

Figure 3E:
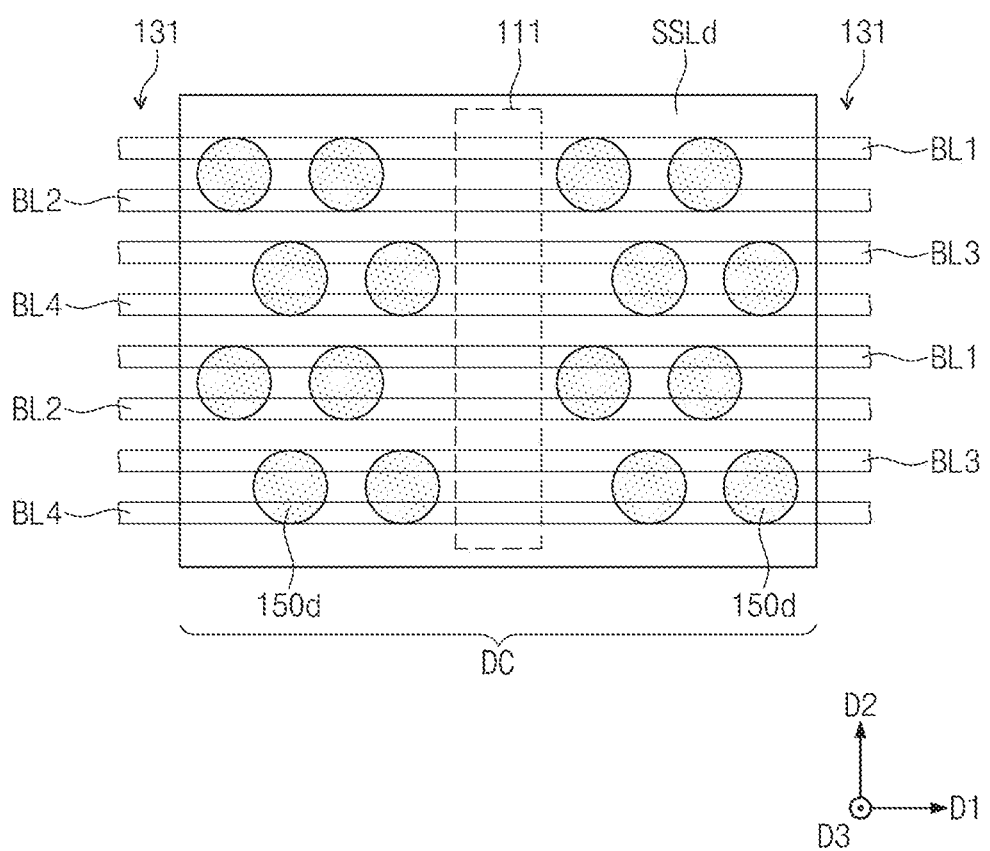
Figure 3F:
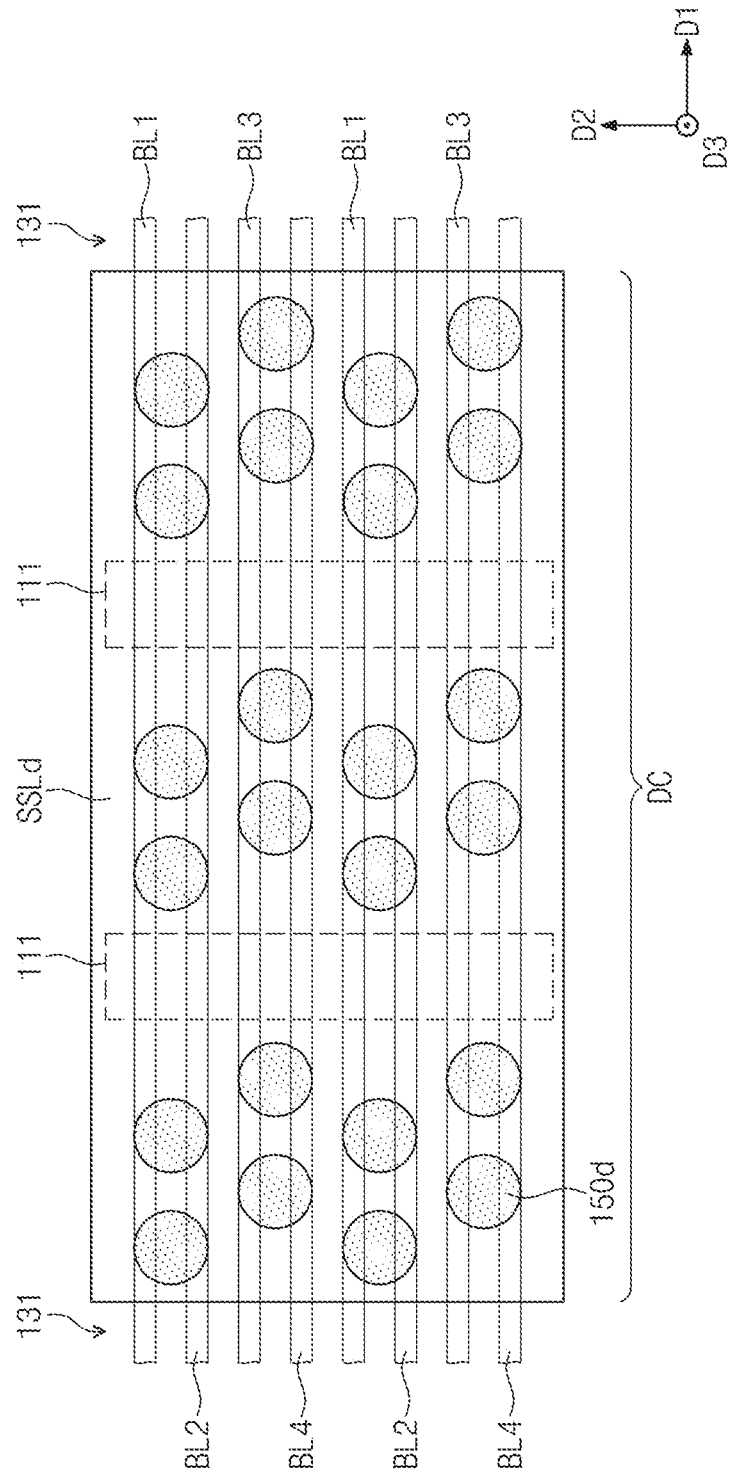

As another example, as shown in FIG. 3E, the dummy cell region DC may further include a dummy region 111 having no dummy channels 150d provided therein. The dummy region 111 may occupy a central region of the dummy string selection line SSLd. The dummy channels 150d may be disposed to have the zigzag arrangement between the dummy region 111 and the word-line cut region 131. Alternatively, as shown in FIG. 3F, the dummy cell region DC may further include a plurality of dummy regions 111 (e.g., two dummy regions 111) by which the dummy string selection line SSLd may be divided into a plurality of portions (e.g., three portions). The dummy channels 150d may be disposed to have the zigzag arrangement between the dummy region 111 and the word-line cut region 131 and between adjacent dummy regions 111.

According to some embodiments, as shown in FIG. 2A, the vertical and dummy channels 150 and 150d provided on the right and left cell regions RC and LC may be arranged to have a mirror image or axial symmetry with respect to (e.g., across/about) the dummy cell region DC.

The lower contacts 152 may be provided on the vertical channels 150. The lower contacts 152 may be electrically connected to the vertical channels 150 through the drains 128. The lower contacts 152 may not be provided on the dummy channels 150d. When viewed in a plan view, the lower contacts 152 may overlap the vertical channels 150, thereby forming a zigzag arrangement, as shown in FIG. 2A. The lower contacts 152 provided on the right and left cell regions RC and LC may be arranged to have a mirror image or symmetry with respect to the dummy cell region DC.

An adjacent pair (e.g., the first and second bit lines BL1 and BL2) of the bit lines BL1-BL4 may be provided on a row of the vertical channels 150 arranged in the first direction D1. Similarly, another adjacent pair (e.g., the third and fourth bit lines BL3 and BL4) of the bit lines BL1-BL4 may be provided on another row of the vertical channels 150 arranged in the first direction D1.

In each of the left and right cell regions LC and RC, the upper contacts 154 may be provided on the word-line cut region 131 and the selection-line cut region 133 and may be arranged along the second direction D2. Each column of the upper contacts 154 arranged along the second direction D2 may be spaced equidistant from each other (for example, with a distance that is about twice the bit line pitch). The upper contacts 154 provided on the word-line cut region 131 may be arranged in such a way that they are shifted from the upper contacts 154 provided on the selection-line cut region 133, by the bit line pitch in the second direction D2.

The upper contacts 154 on the right cell region RC may be arranged in such a way that they are shifted from the upper contacts 154 on the left cell region LC, by the bit line pitch in the second direction D2.

For example, the upper contacts 154, which are provided on the word-line cut regions 131 positioned at both sides of the left cell region LC, may be provided below the first bit line BL1 and the third bit line BL3. The upper contacts 154 on the selection-line cut region 133 of the left cell region LC may be provided below the second bit line BL2 and the fourth bit line BL4.

By contrast, the upper contacts 154, which are provided on the word-line cut regions 131 positioned at both sides of the right cell region RC, may be provided below the second bit line BL2 and the fourth bit line BL4. The upper contacts 154 on the selection-line cut region 133 of the right cell region RC may be provided below the first bit line BL1 and the third bit line BL3.

The auxiliary lines SBL1-SBL4 may be arranged spaced equidistant (e.g., by a distance that is about twice the bit line pitch) from each other along the second direction D2. The auxiliary lines SBL1-SBL4 may include the first auxiliary line SBL1 and the third auxiliary line SBL3, which are adjacent to the selection-line cut region 133 and are alternately arranged along the second direction D2, and the second auxiliary line SBL2 and the fourth auxiliary line SBL4, which are adjacent to the word-line cut region 131 and are alternately arranged along the second direction D2.

In each of the left and right cell regions LC and RC, the second auxiliary lines SBL2 and the third auxiliary lines SBL3 may be arranged along the first direction D1 below the first and second bit lines BL1 and BL2. The first auxiliary lines SBL1 and the fourth auxiliary lines SBL4 may be arranged along the first direction D1 below the third and fourth bit lines BL3 and BL4.

As shown in FIG. 2A, the auxiliary lines SBL1-SBL4 may have a curved/bending or non-linear shape, when viewed in a plan view. Planar shapes of the auxiliary lines SBL1-SBL4 provided on the right and left cell regions RC and LC may be arranged to have a mirror image or symmetry with respect to (e.g., across/about) the second direction D2. For example, each of the auxiliary lines SBL1-SBL4 of the right cell region RC may have an inverted shape (i.e., a mirror-image shape) of a corresponding one of the auxiliary lines SBL1-SBL4 of the left cell region LC. In other words, ones of the auxiliary lines SBL1-SBL4 on an imaginary line parallel to the first direction D1 may be arranged to have a point symmetry with respect to the dummy cell region DC. Ones of the auxiliary lines SBL1-SLB4 having the point symmetry may have a substantially same length.

There may be a difference in distances between the auxiliary lines SBL1-SBL4 and the respective upper contacts 154, and thus, there may be a difference in lengths of the auxiliary lines SBL1-SBL4. As an example, the first auxiliary line SBL1 may have a first length, which is the shortest length of the auxiliary lines SBL1-SBL4, and the fourth auxiliary line SBL4 may have a fourth length, which is the longest length of the auxiliary lines SBL1-SBL4. The second auxiliary line SBL2 may have a second length, which is longer than the first length and is shorter than the fourth length, and the third auxiliary line SBL3 may have a third length, which is longer than the second length and is shorter than the fourth length.

According to some embodiments, each of the bit lines BL1-BL4 may be electrically connected to the auxiliary lines SBL1-SBL4 with different lengths.

As an example, as shown in FIGS. 2A and 2B, the first bit line BL1 may be electrically connected to the second auxiliary line SBL2 in the left cell region LC and may be electrically connected to the third auxiliary line SBL3 in the right cell region RC. The second bit line BL2 may be electrically connected to the third auxiliary line SBL3 in the left cell region LC and may be electrically connected to the second auxiliary line SBL2 in the right cell region RC. An opposite pair of the third auxiliary lines SBL3, which are provided on the dummy channel 150d in each of the left and right cell regions LC and RC, may be connected to form a single auxiliary line connected in common to the second bit line BL2.

As shown in FIGS. 2A and 2C, the third bit line BL3 may be electrically connected to the fourth auxiliary line SBL4 in the left cell region LC and may be electrically connected to the first auxiliary line SBL1 in the right cell region RC. The fourth bit line BL4 may be electrically connected to the first auxiliary line SBL1 in the left cell region LC and may be electrically connected to the fourth auxiliary line SBL4 in the right cell region RC. An opposite pair of the first auxiliary lines SBL1, which are provided on the selection-line cut region 133 in each of the left and right cell regions LC and RC, may be connected to form a single auxiliary line connected in common to the fourth bit line BL4.

Each of the first and second bit lines BL1 and BL2 may be electrically connected to the second auxiliary line SBL2 with a second length and the third auxiliary line SBL3 with a third length. This makes it possible to remove a difference in connection structure between the first and second bit lines BL1 and BL2 and the auxiliary lines, and thus, the first and second bit lines BL1 and BL2 can have substantially the same electric characteristics (e.g., in terms of loading capacitance and resistance). The third and fourth bit lines BL3 and BL4 may have substantially the same connection structure; for example, each of the third and fourth bit lines BL3 and BL4 may be electrically connected to the first auxiliary line SBL1 and the fourth auxiliary line SBL4. Accordingly, the third and fourth bit lines BL3 and BL4 may have substantially the same electric characteristics.

A total length (e.g., 2+3=5) of the second and third auxiliary lines SBL2 and SBL3 connected to the first bit line BL1 may be equal or similar to a total length (e.g., 1+4=5) of the first and fourth auxiliary lines SBL1 and SBL4 connected to the fourth bit line BL4. A total length (e.g., 2+3=5) of the second and third auxiliary lines SBL2 and SBL3 connected to the second bit line BL2 may be equal or similar to a total length (e.g., 1+4=5) of the first and fourth auxiliary lines SBL1 and SBL4 connected to the third bit line BL3. Accordingly, the first and fourth bit lines BL1 and BL4, which are disposed adjacent to each other, and the second and third bit lines BL2 and BL3, which are disposed adjacent to each other, may have substantially the same electric characteristics.

As another example, the first auxiliary line SBL1 may have substantially the same length (e.g., 2) as that of the second auxiliary line SBL2, and the third auxiliary line SBL3 may have substantially the same length (e.g., 3) as that of the fourth auxiliary line SBL4. For example, a total length (e.g., 2+3=5) of the second auxiliary line SBL2 and the third auxiliary line SBL3 connected to each of the first and second bit lines BL1 and BL2 may be substantially equal to a total length (e.g., 3+2=5) of the first and fourth auxiliary lines SBL1 and SBL4 connected to each of the third and fourth bit lines BL3 and BL4. Accordingly, the first to the fourth bit lines BL1-BL4 may have substantially the same electric characteristics. Moreover, as used herein, the phrase "substantially equal to" may refer to a value that can vary by up to +/−ten percent (10%). For example, a first length that is substantially equal to a second length may be within ten percent of the second length. The present inventive entity further appreciates that the values of length described herein (e.g., 1, 2, 3, 4, 5, etc.) may correspond to values in tens of nanometers (nm) (e.g., 10 nm, 20 nm, 30 nm, 40 nm, 50 nm, etc.).

Example of Fabrication Method

FIGS. 4A through 9A are plan views illustrating a method of fabricating a semiconductor memory device according to example embodiments of present inventive concepts. FIGS. 4B through 9B are sectional views taken along line IA-IB of FIGS. 4A through 9A, respectively. FIGS. 4C through 9C are sectional views taken along line IIA-IIB of FIGS. 4A through 9A, respectively.

Figure 4A:
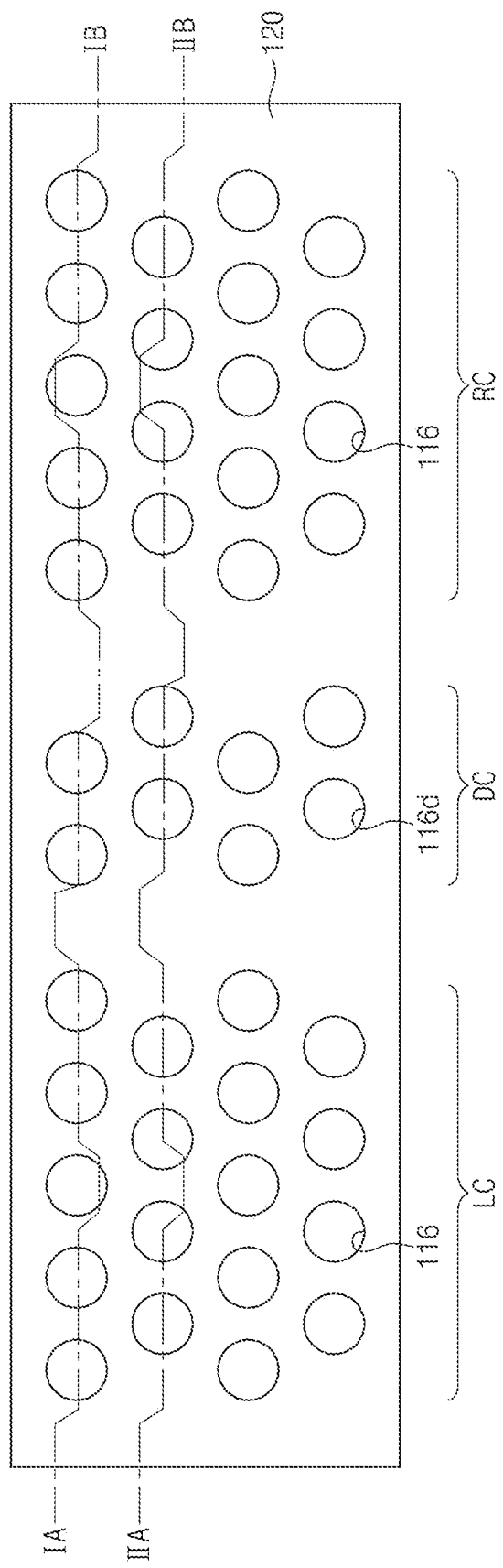
Figure 4B:
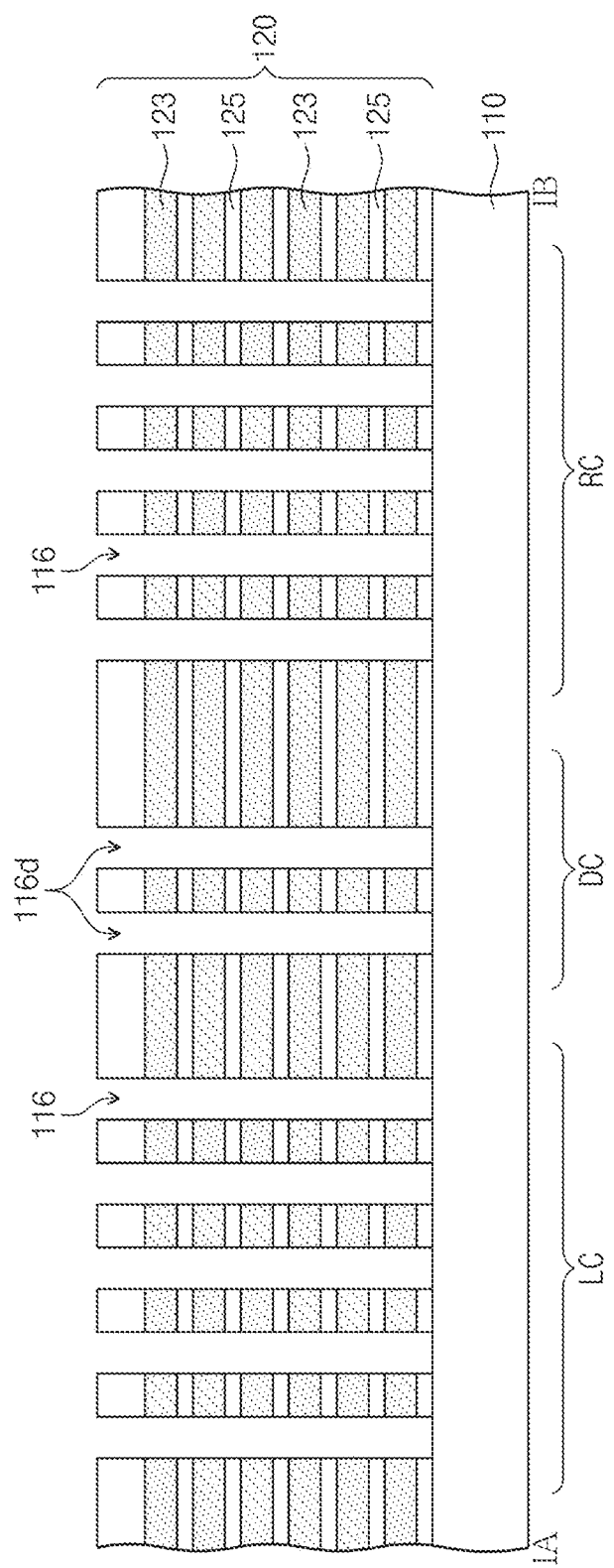

Referring to FIGS. 4A, 4B, and 4C, a mold stack 120 may be formed on the semiconductor substrate 110 of the first conductivity type (e.g., a p-type silicon wafer), and a plurality of vertical holes 116 may be formed to penetrate the mold stack 120. The semiconductor substrate 110 may include the left cell region LC, the right cell region RC, and the dummy cell region DC between the left cell region LC and the right cell region RC. The mold stack 120 may be formed by alternately depositing the insulating layers 125 and sacrificial layers 123. As an example, the insulating layers 125 may be formed of or include a silicon oxide layer, and the sacrificial layers 123 may be formed of or include a silicon nitride layer.

The vertical holes 116 may be formed by etching portions of the mold stack 120 corresponding to the left and right cell regions LC and RC. In some embodiments, a portion of the mold stack 120 corresponding to the dummy cell region DC may be etched to form dummy holes 116d. The vertical holes 116 may be formed to have the mirror symmetry with respect to the dummy cell region DC.

Figure 5A:
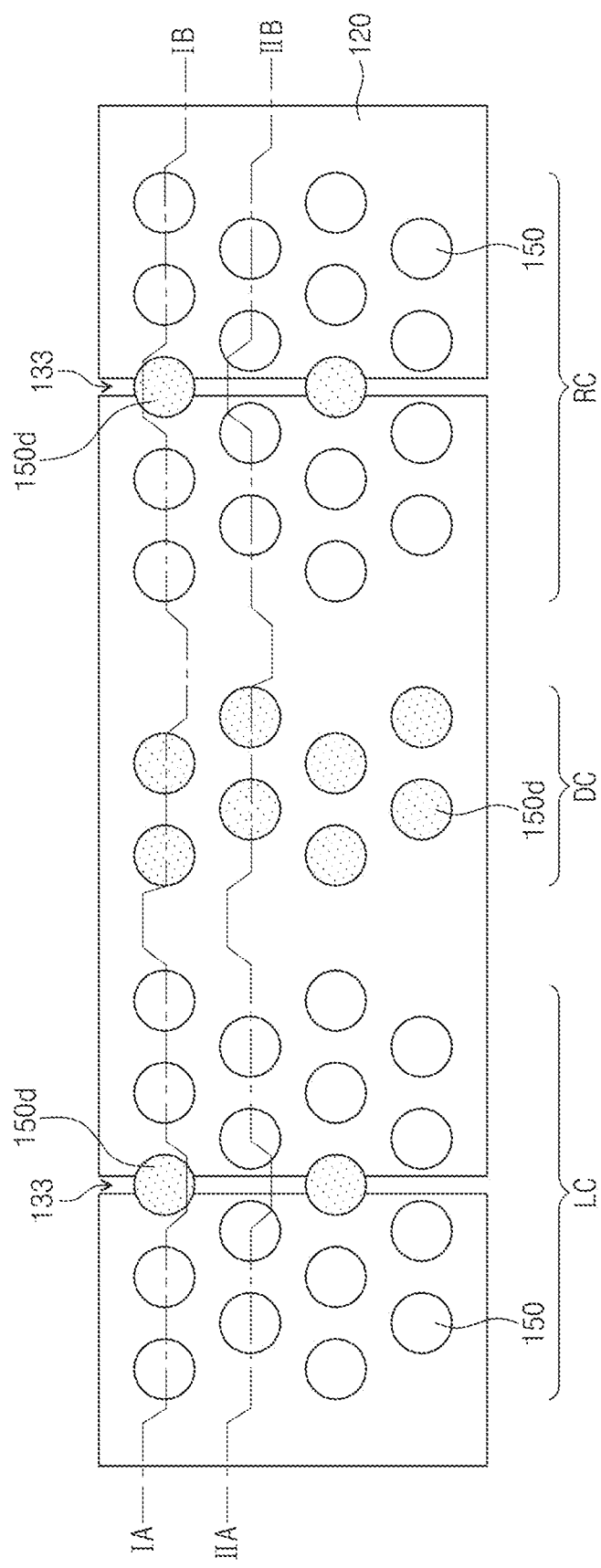
Figure 5B:
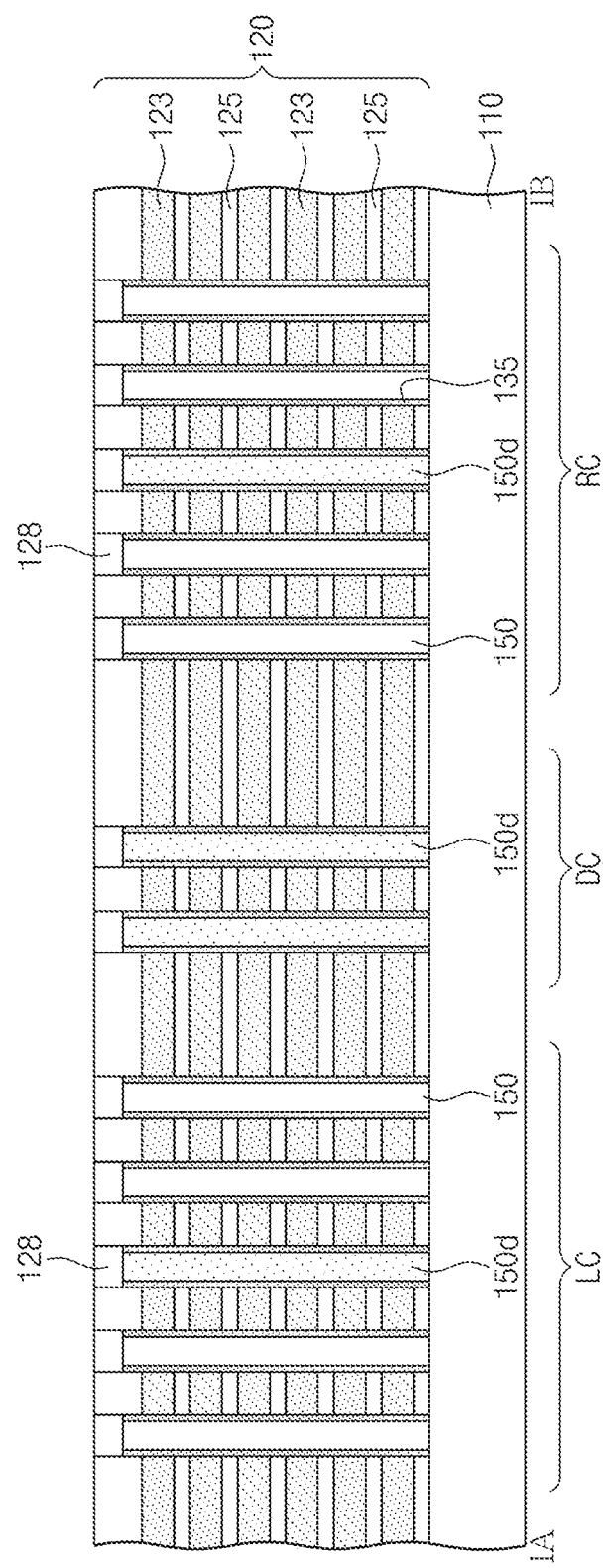
Figure 5C:
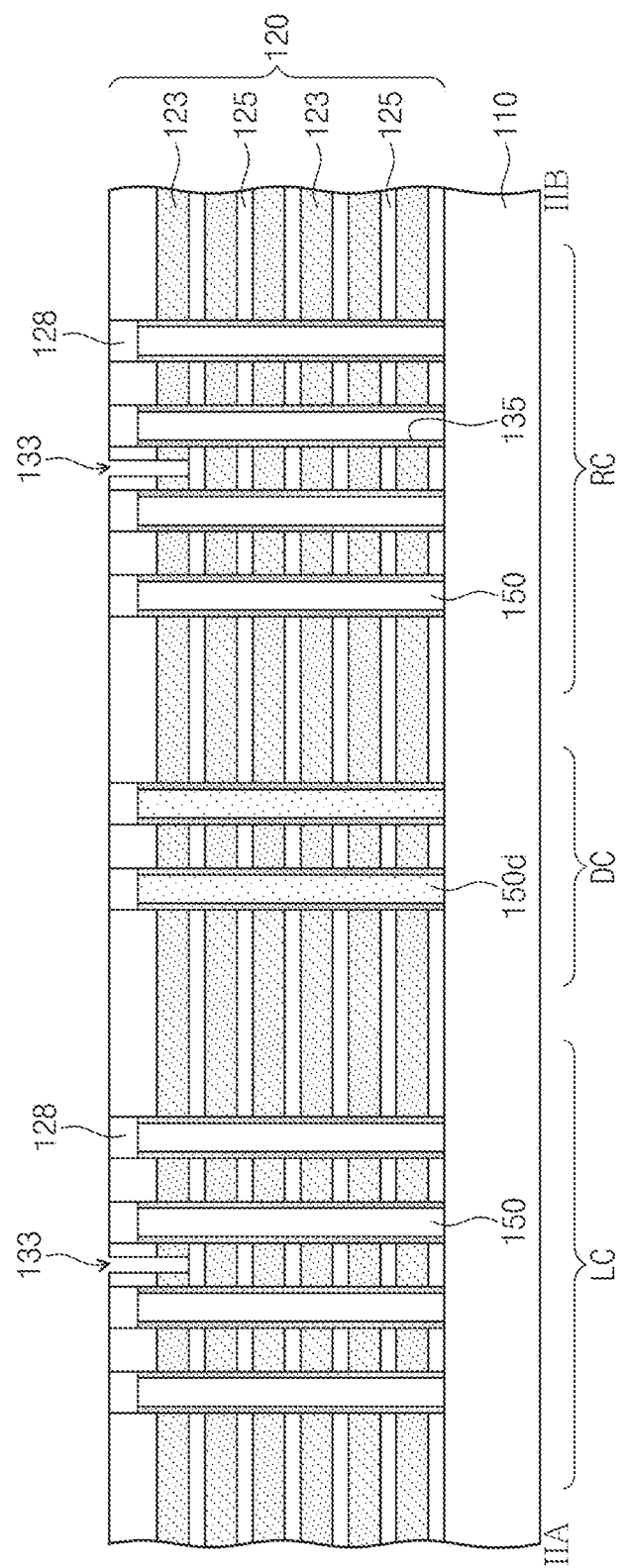

Referring to FIGS. 5A, 5B, and 5C, the memory layer 135 and the vertical channel 150 enclosed therewith may be formed in the vertical hole 116. The vertical channel 150 may be, for example, a semiconductor layer of the first conductivity type (e.g., p-type). A top portion of the vertical channel 150 may be used as the drain 128. The drain 128 may be formed to have the second conductivity type (e.g., n-type). The formation of the vertical channel 150 may be performed to form the dummy channel 150d filling the dummy hole 116d. The dummy channel 150d may be formed to have substantially the same structure as the vertical channel 150.

Before the formation of the vertical channel 150, the memory layer 135 may be formed on an inner sidewall of the vertical hole 116. In example embodiments, the memory layer 135 may include oxide, nitride, and oxide layers sequentially deposited on the inner sidewall of the vertical hole 126. As another example, the memory layer 135 may be formed by depositing a variable resistance layer (e.g., of chalcogen compounds or transition metal oxides).

Before or after the formation of the vertical channels 150, the mold stack 120 in each of the left and right cell regions LC and RC may be partially etched to form the selection-line cut region 133. The formation of the selection-line cut region 133 may include selectively etching the uppermost insulating layer 125 and the uppermost sacrificial layer 123, and the selection-line cut region 133 may be formed to have a trench shape. The vertical channels 150 arranged along the selection-line cut region 133 may not be used for electric operations of the semiconductor memory device, thereby serving as the dummy channels 150d.

Figure 6A:
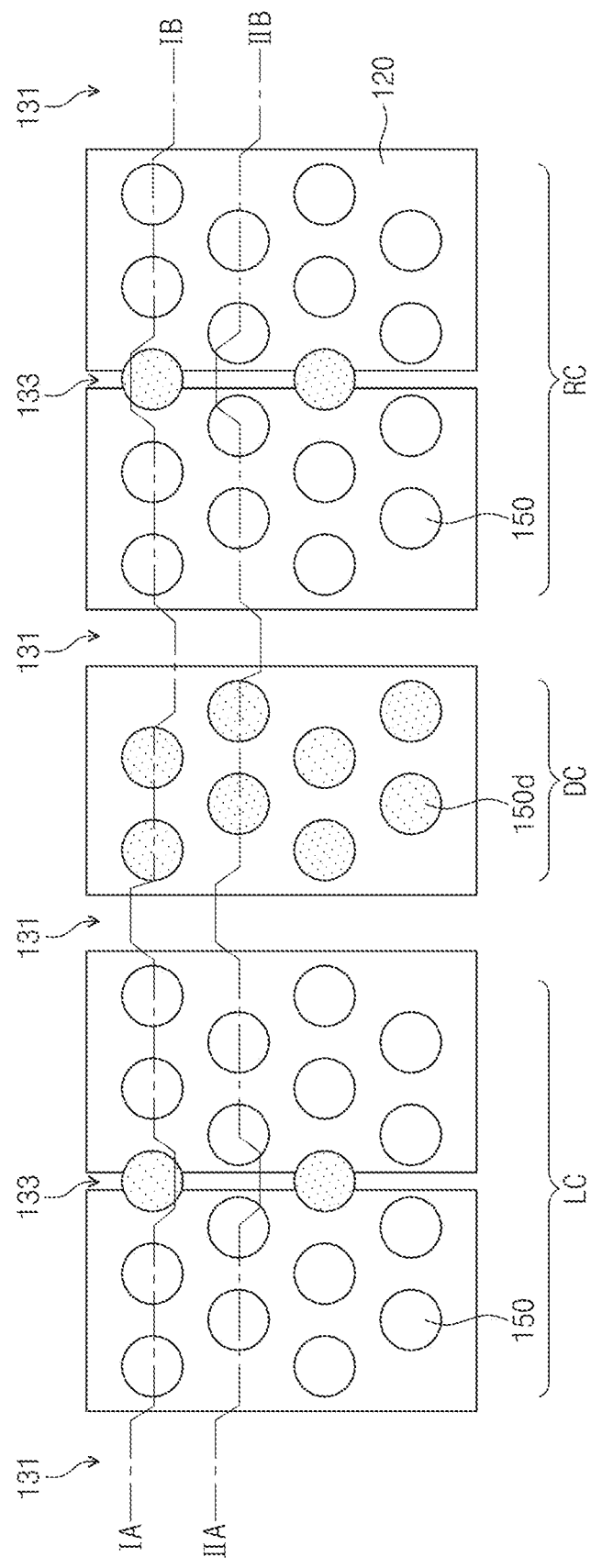
Figure 6B:
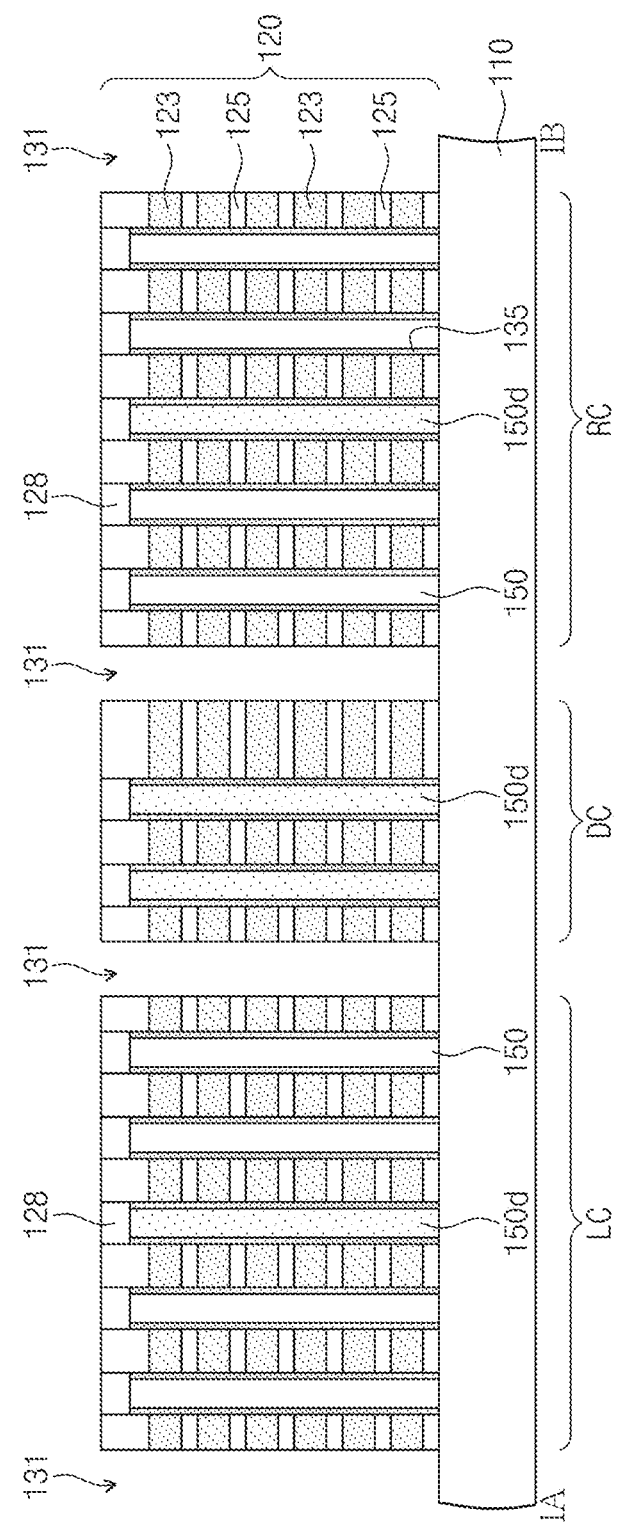

Referring to FIGS. 6A, 6B, and 6C, the mold stack 120 may be selectively etched to form the word-line cut region 131 exposing the semiconductor substrate 110. The word-line cut region 131 may be formed to define opposite edges of each of the left and right cell regions LC and RC. The selection-line cut region 133 may be filled with the insulating layer 143 (e.g., of silicon oxide), before or after the formation of the word-line cut region 131.

Figure 7C:
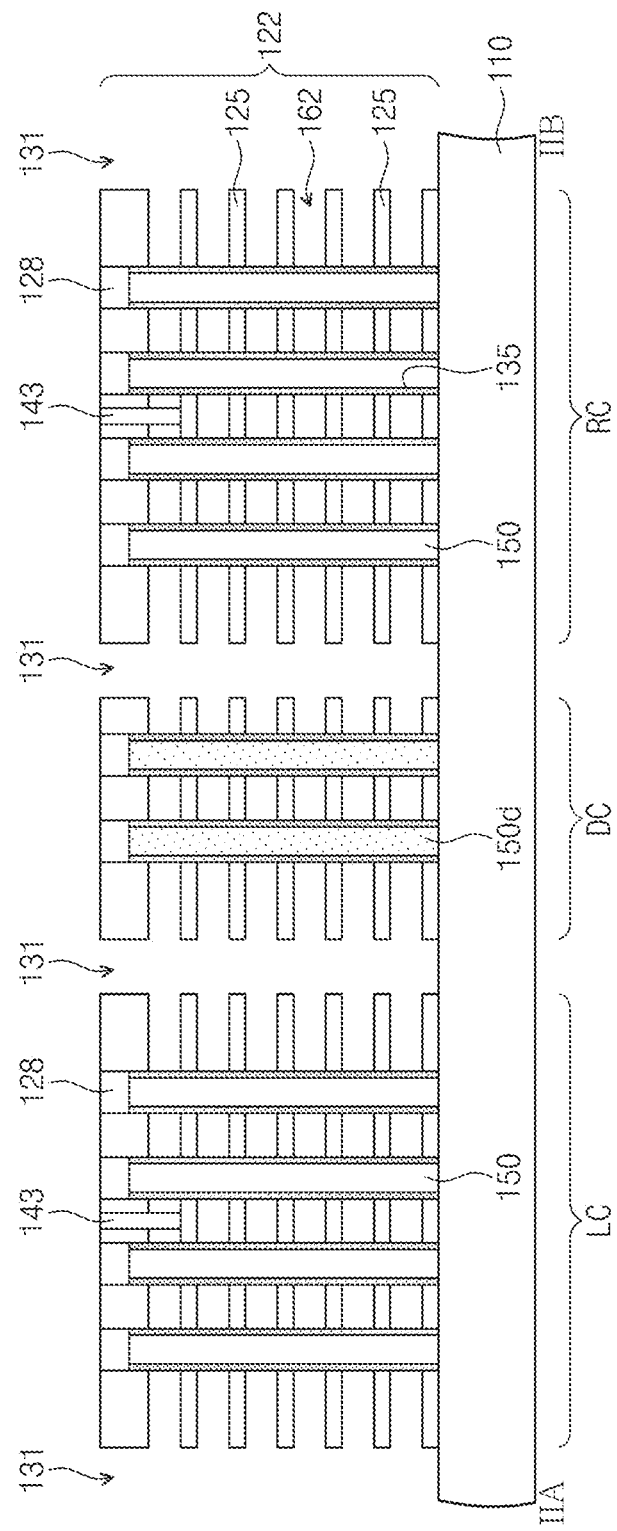

Referring to FIGS. 7A, 7B, and 7C, the sacrificial layers 123 exposed by the word-line cut region 131 may be removed to form a mold wing 122 with gate regions 132. For example, in the case where the sacrificial layers 123 are formed of a silicon nitride layer, the sacrificial layers 123 may be selectively removed using etching solution containing phosphoric acid to form the gate regions 132.

Figure 8A:
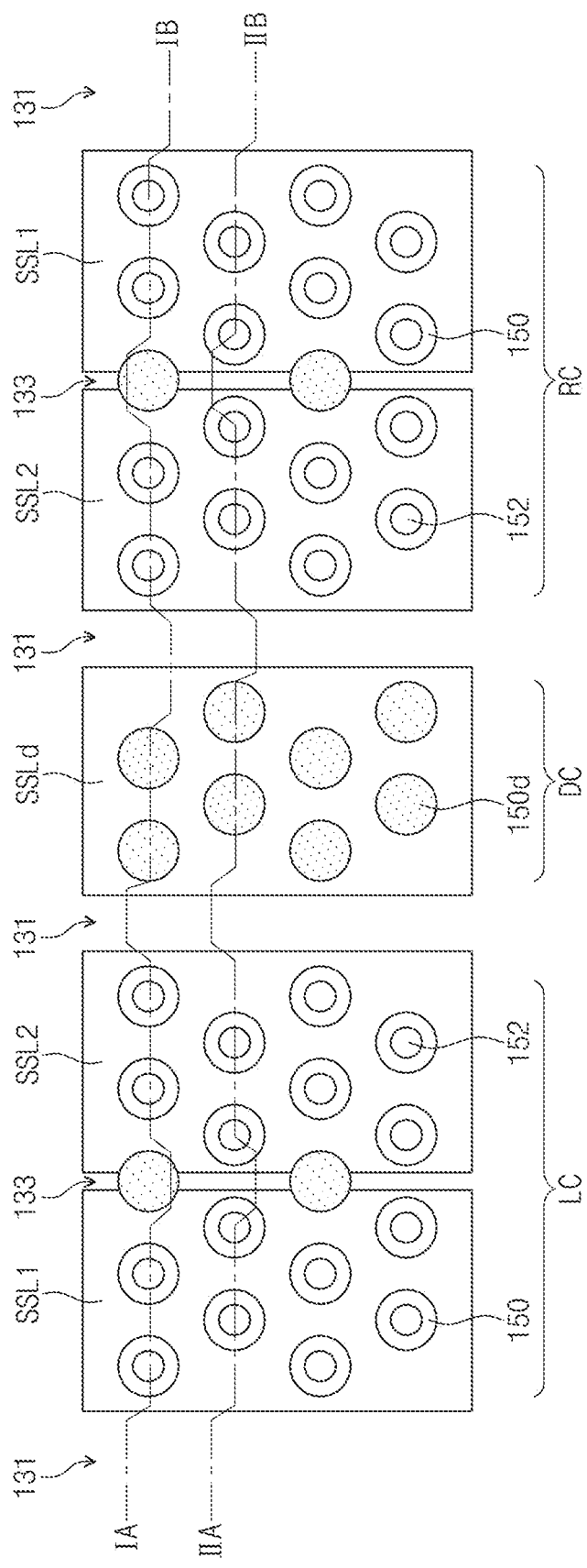
Figure 8B:
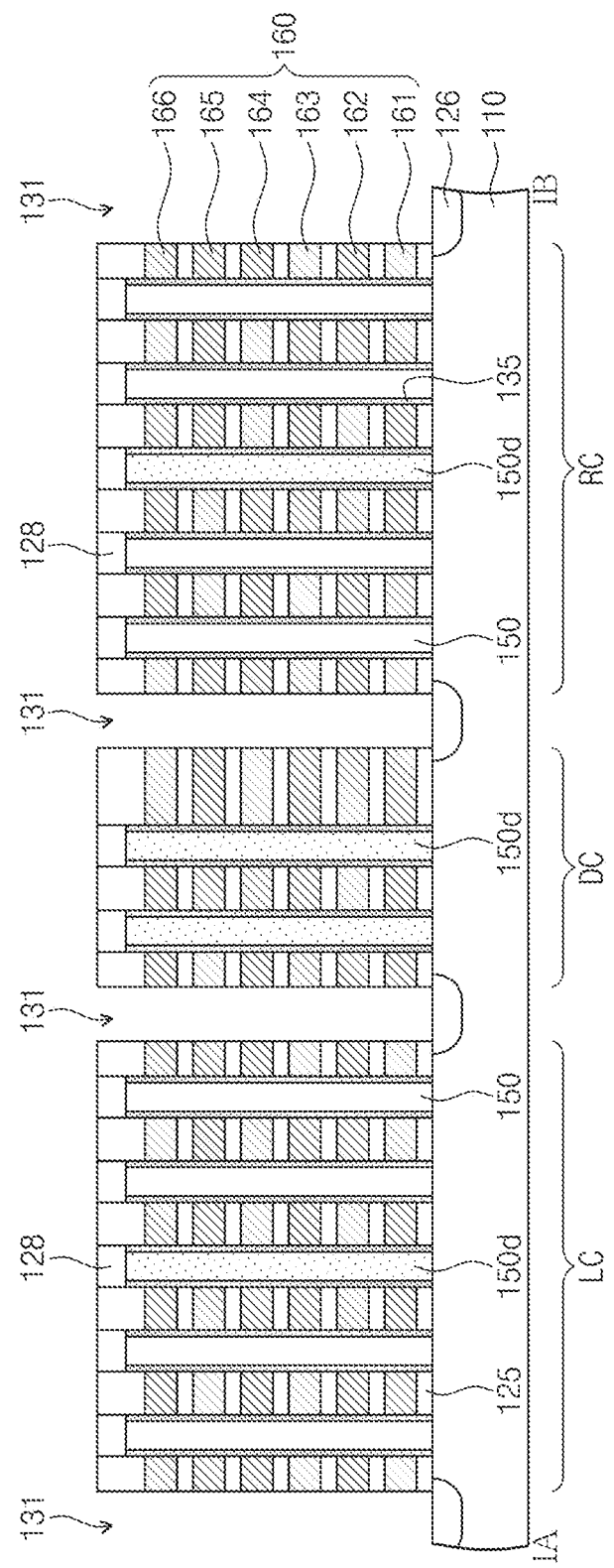
Figure 8C:
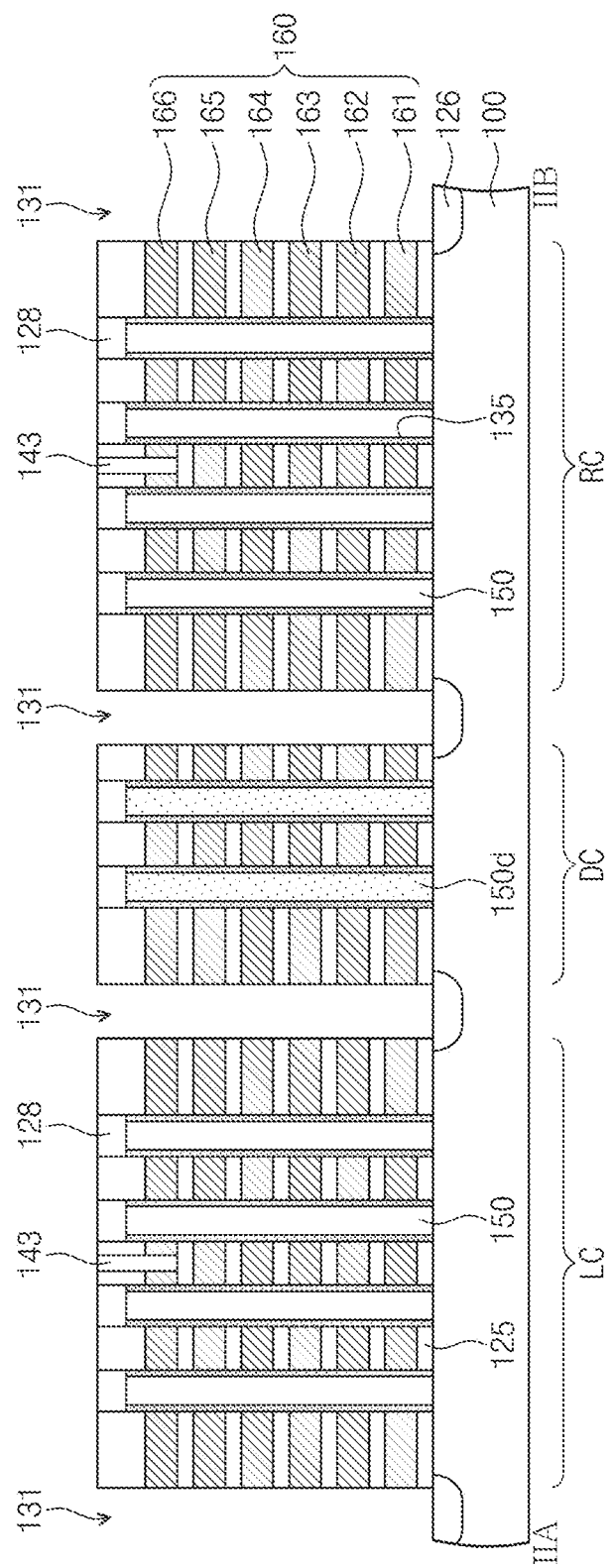

Referring to FIGS. 8A, 8B, and 8C, a conductive layer may be formed to fill the gate regions 132 and thereby form the gate stack 160. The gate stack 160 may include the plurality of the gates 161-166, which are vertically stacked along the vertical channel 150 and are spaced apart from each other by insulating layers 125. The gates 161-166 may include at least one of a doped silicon layer, a metal layer (e.g., tungsten), a metal nitride layer, or a metal silicide layer. Impurities may be injected into a portion of the semiconductor substrate 110 exposed by the word-line cut region 131 to form the common source 126 with a second conductivity type (e.g., n-type).

The gates 161-166 may include at least one first gate 161, which is provided adjacent to the semiconductor substrate 110 to serve as a ground selection line GSL, at least one sixth gate 166, which is provided adjacent to the bit lines BL1-BL4 to serve as a string selection line SSL, and second to fifth gates 162-165, which are provided between the ground selection line GSL and the string selection line SSL to serve as the word lines WL. The common source 126 may serve as the common source line (CSL).

In each of the left and right cell regions LC and RC, the sixth gate 166 may include the first string selection line SSL1 and the second string selection line SSL2, which are divided by the selection-line cut region 133. The sixth gate 166 in the dummy cell region DC may serve as the dummy string selection line SSLd.

Figure 9A:
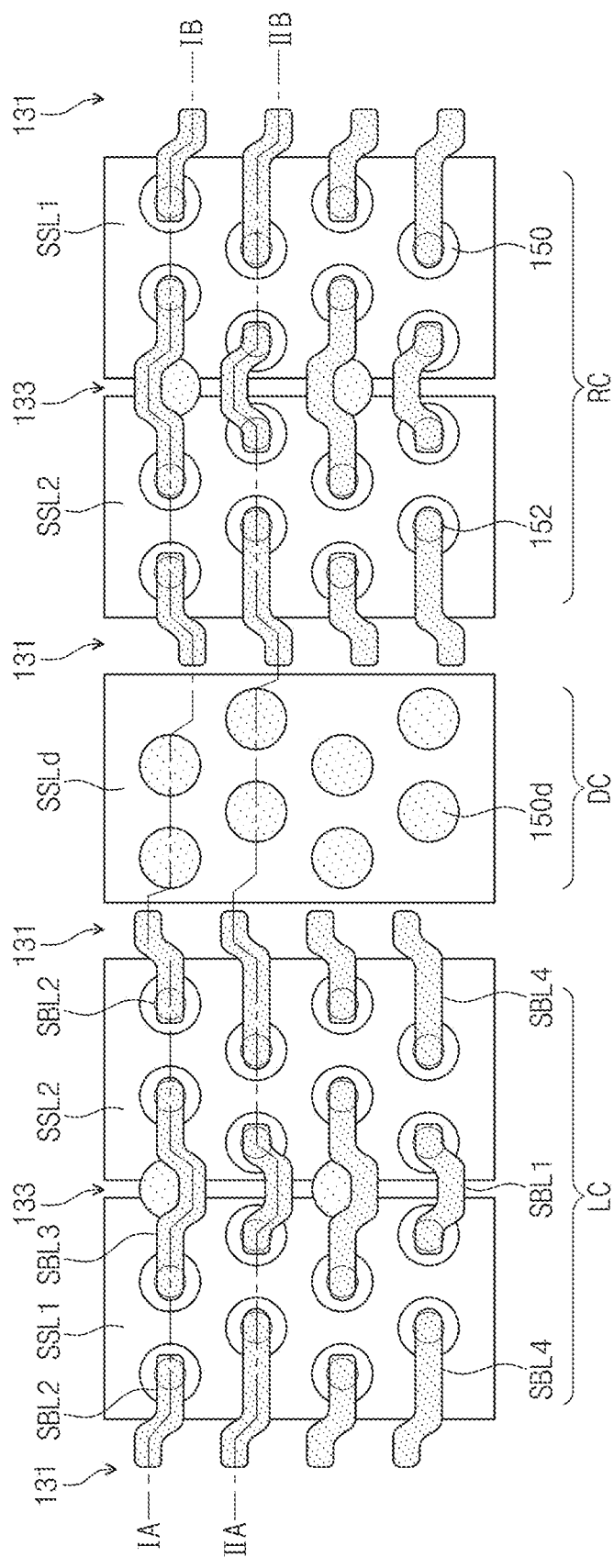
Figure 9B:
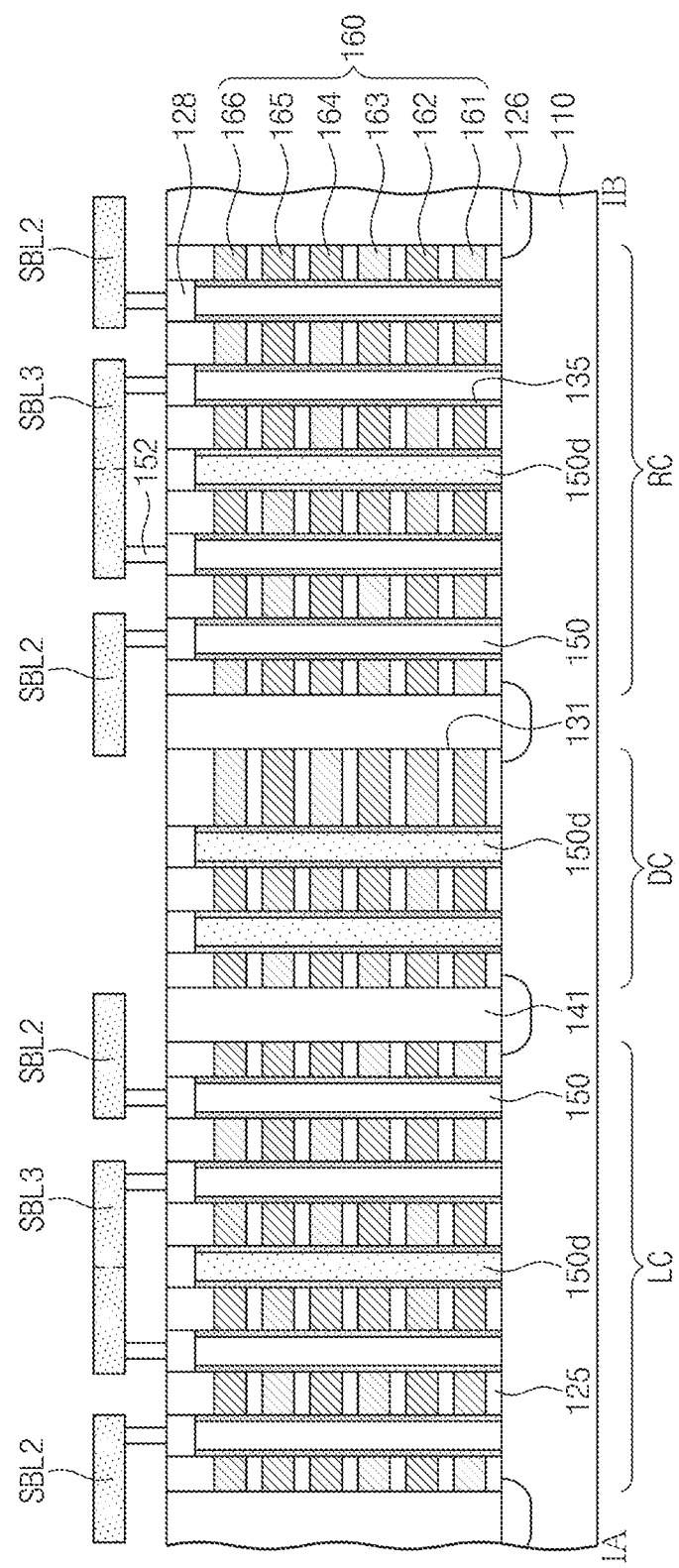
Figure 9C:
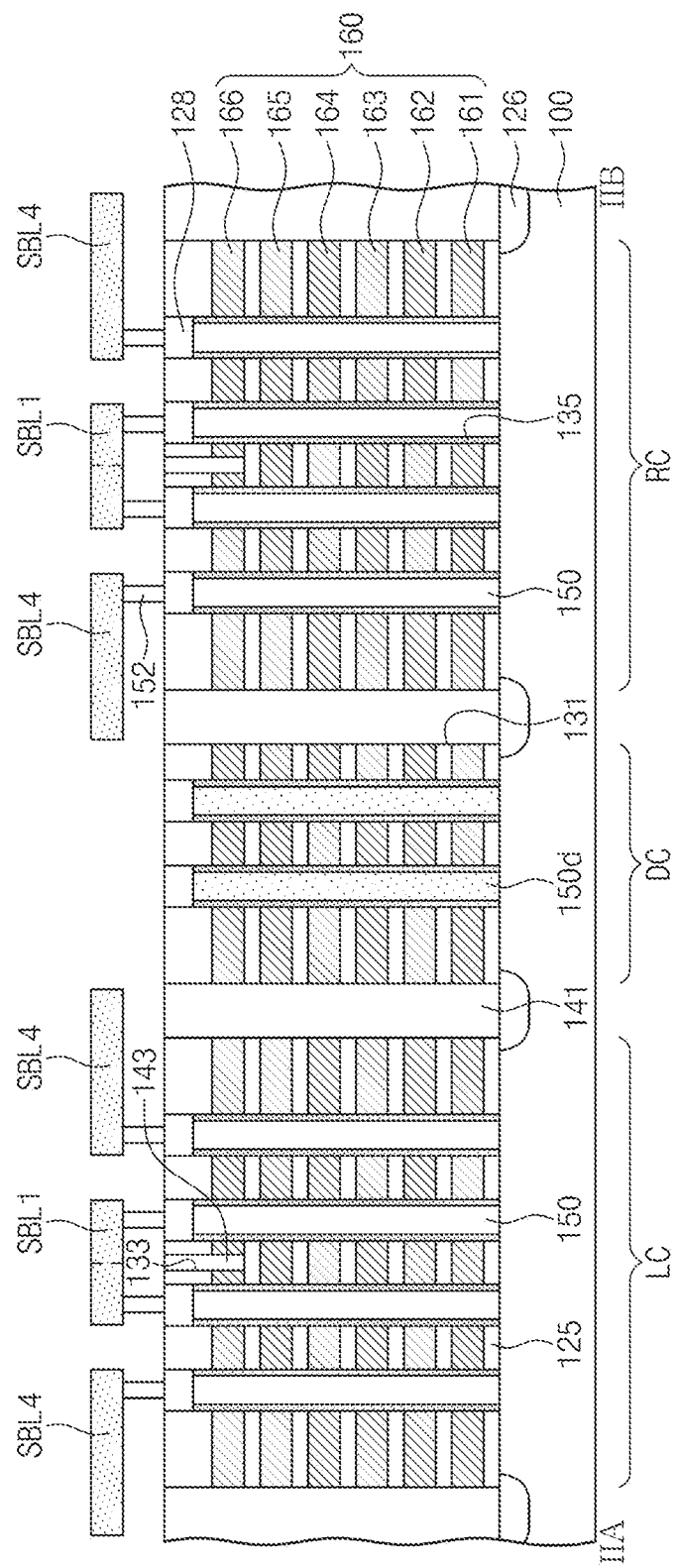

Referring to FIGS. 9A, 9B, and 9C, the word-line cut region 131 may be filled with the insulating layer 141. Thereafter, the lower contacts 152 may be formed to be aligned with the vertical channels 150, and then, the auxiliary lines SBL1-SBL2 may be formed to be coupled to the lower contacts 152. The lower contacts 152 and the auxiliary lines SBL1-SBL2 may be formed to have the same arrangement as that described with reference to FIGS. 2A through 2C.

Referring back to FIGS. 2A, 2B, and 2C, the upper contacts 154 may be formed to be electrically connected to the auxiliary lines SBL1-SBL4, and the bit lines BL1-BL4 may be formed to be electrically connected to the upper contacts 154, thereby fabricating the semiconductor memory device 1a. The upper contacts 154 and the bit lines BL1-BL4 may be formed to have the same arrangement as that described with reference to FIGS. 2A through 2C.

Example Embodiments

Figure 10A:
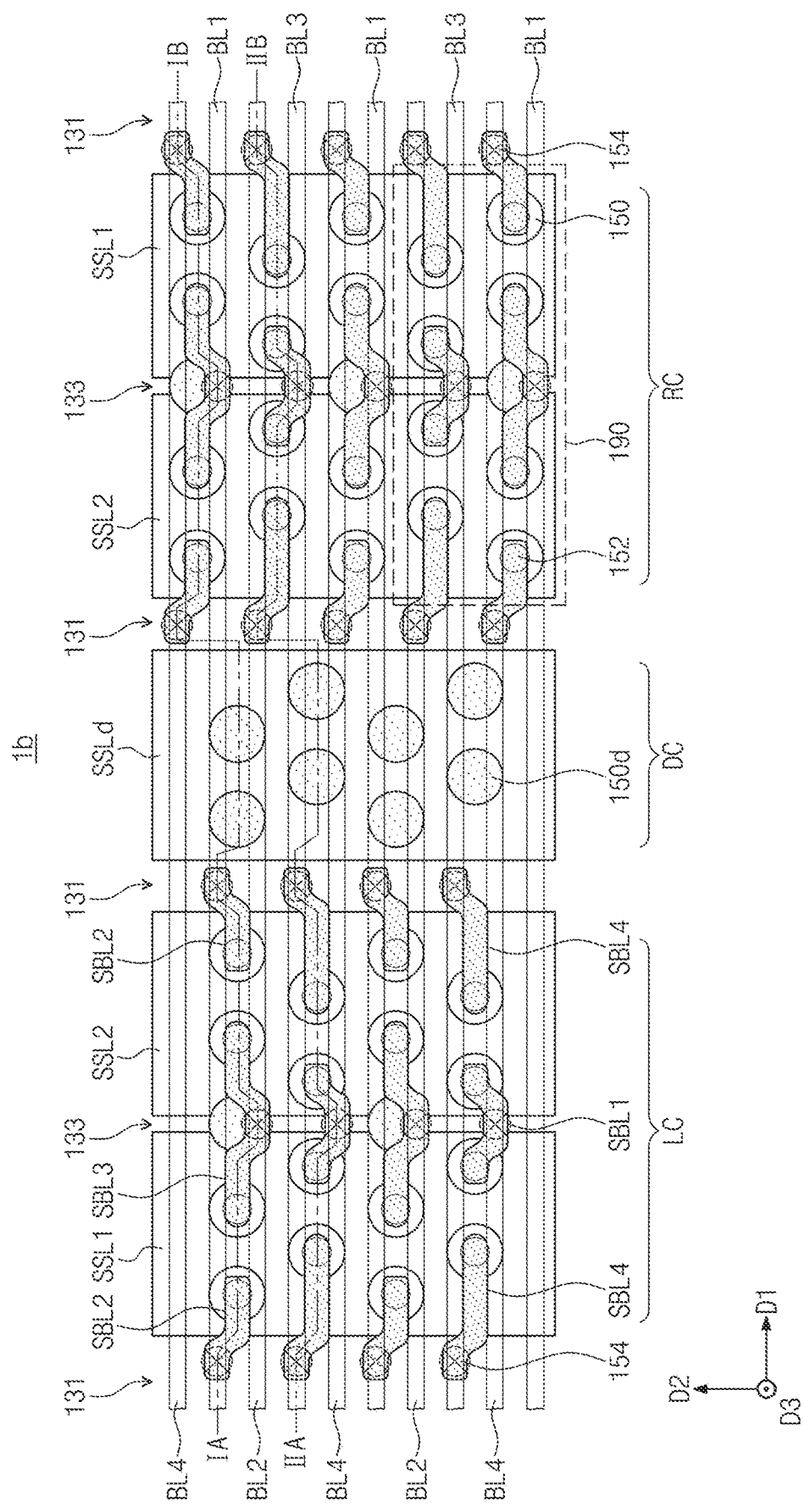
FIG. 10A is a plan view illustrating a semiconductor memory device according to some example embodiments of present inventive concepts.
Figure 10B:
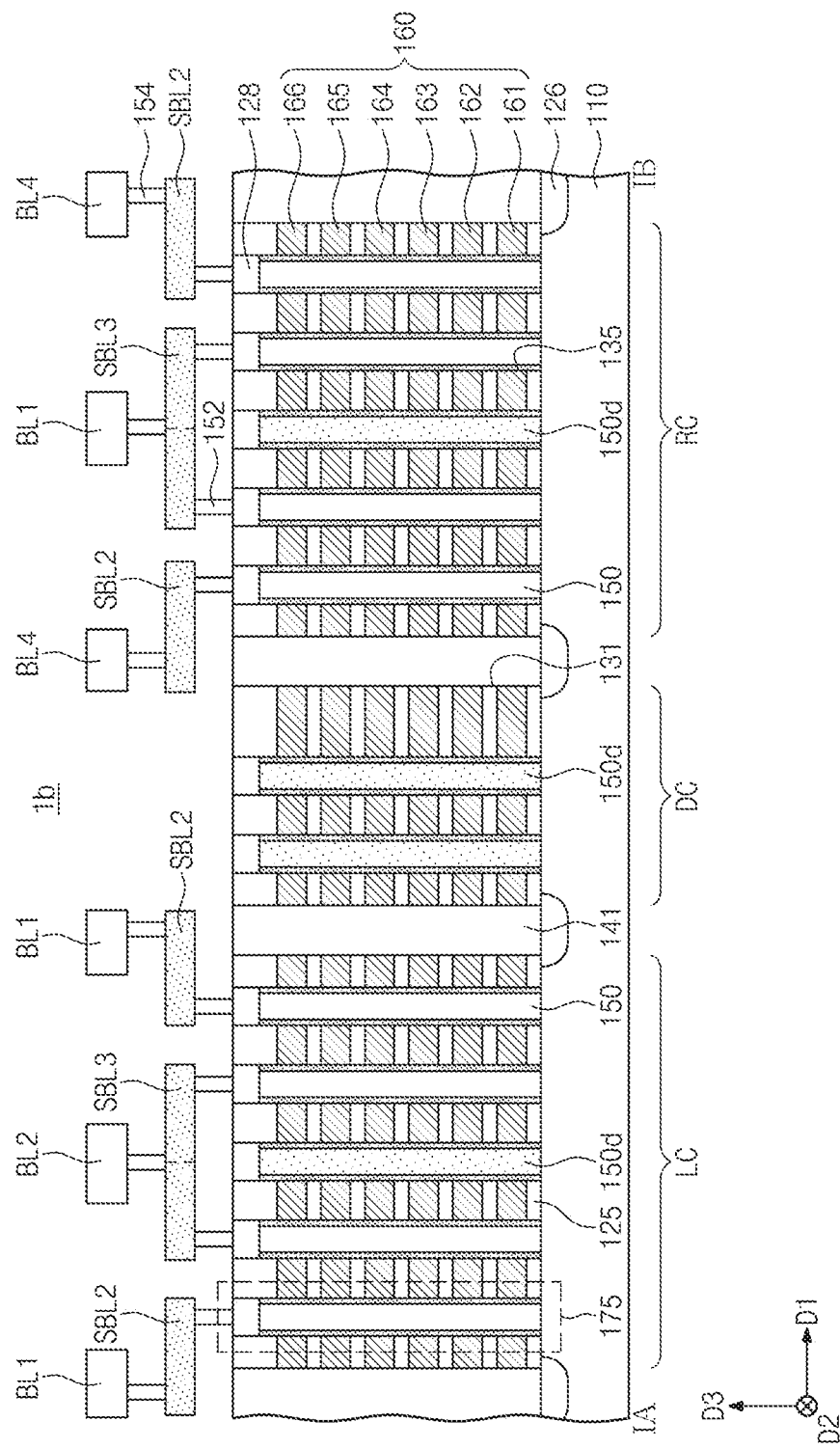
FIG. 10B is a sectional view taken along line IA-IB of FIG. 10A.
Figure 10C:
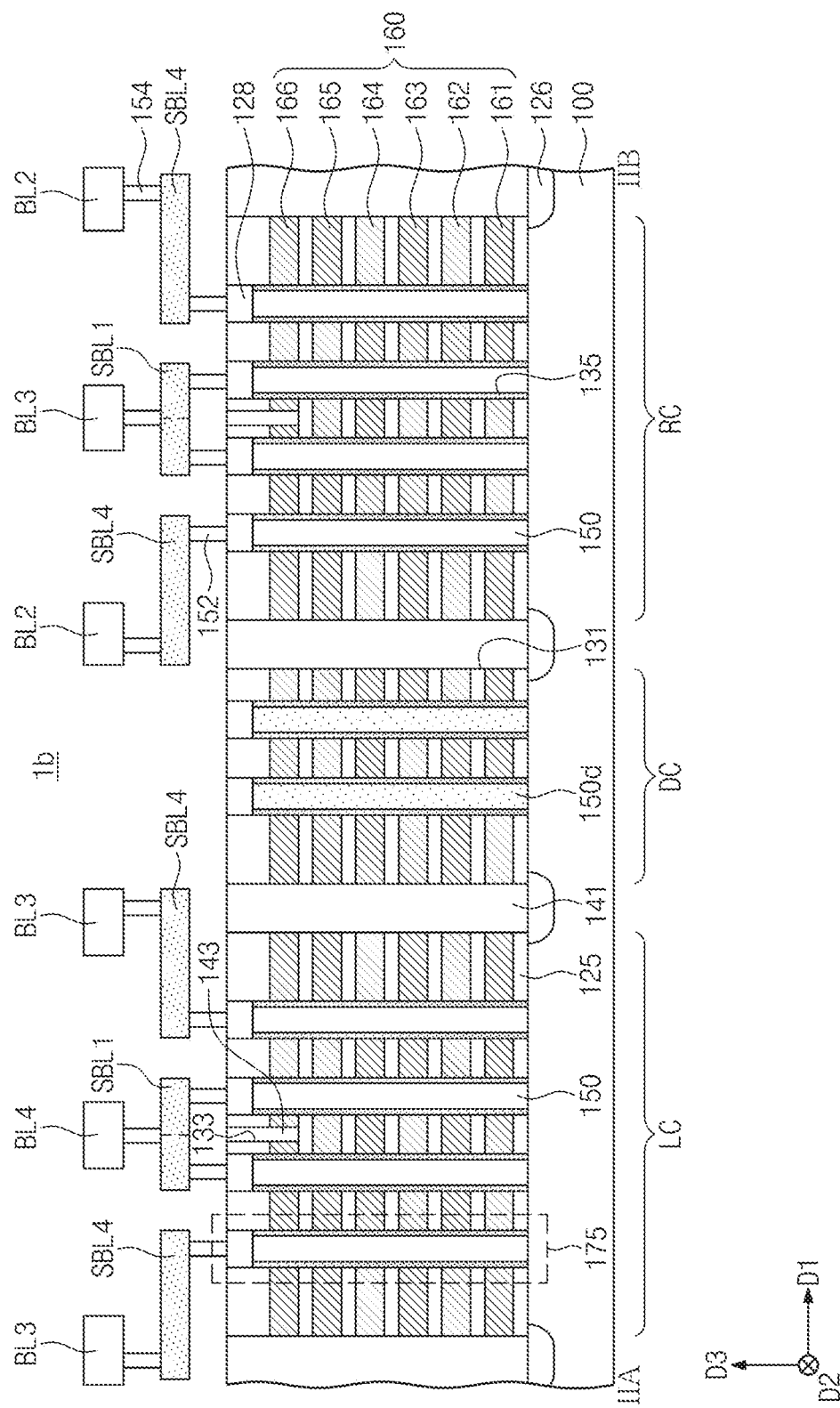
FIG. 10C is a sectional view taken along line IIA-IIB of FIG. 10A.

FIG. 10A is a plan view illustrating a semiconductor memory device according to some example embodiments of present inventive concepts. FIG. 10B is a sectional view taken along line IA-IB of FIG. 10A. FIG. 10C is a sectional view taken along line IIA-IIB of FIG. 10A. In the description that follows, a discussion of features identical to those of FIGS. 2A through 2C may be reduced/omitted/minimized to avoid redundancy.

Referring to FIGS. 10A, 10B, and 10C, the semiconductor memory device 1b may be configured to include a plurality of cell arrays 190, which are repeatedly provided, and each of which has nine channels, similar or identical to the semiconductor memory device 1a of FIG. 2A. Unlike the semiconductor memory device 1a, the vertical and dummy channels 150 and 150d of the right and left cell regions RC and LC may be arranged not to have a mirror image or symmetry with respect to the dummy cell region DC. For example, the vertical and dummy channels 150 and 150d of the right cell region RC may be arranged in such a way that they are shifted from the vertical and dummy channels 150 and 150d of the left cell region LC, by the bit line pitch in the second direction D2.

The auxiliary lines SBL1-SBL4 on the right cell region RC may have substantially the same planar shapes as those on the left cell region LC. The auxiliary lines SBL1-SLB4 on the right cell region RC may be arranged in such a way that they are shifted from the auxiliary lines SBL1-SBL4 on the left cell region LC, by the bit line pitch in the second direction D2.

Each of the bit lines BL1-BL4 may be electrically connected to the auxiliary lines SBL1-SBL4 with different lengths, and this makes it possible to remove a difference in connection structure between the bit lines BL1-BL4 and the auxiliary lines SBL1-SBL4.

For example, the first bit line BL1 may be connected to the second auxiliary line SBL2 on the left cell region LC and to the third auxiliary line SBL3 on the right cell region RC. The second bit line BL2 may be connected to the third auxiliary line SBL3 on the left cell region LC and to the fourth auxiliary line SBL4 on the right cell region RC. The third bit line BL3 may be connected to the fourth auxiliary line SBL4 on the left cell region LC and to the first auxiliary line SBL1 on the right cell region RC. The fourth bit line BL4 may be connected to the first auxiliary line SBL1 on the left cell region LC and to the second auxiliary line SBL2 on the right cell region RC.

Unlike FIGS. 10A-10C, if each of the bit lines BL1-BL4 is connected to auxiliary lines with the same length, there may be a difference in electric characteristics of the bit lines BL1-BL4. For example, one of the bit lines BL1-BL4 may be connected to the first auxiliary lines SBL1 with a shorter length, and another of the bit lines BL1-BL4 may be connected to the fourth auxiliary lines SBL4 with a longer length. In this case, there may be a difference in electric characteristics between the bit lines, which are respectively connected to the first auxiliary lines SBL1 and the fourth auxiliary lines SBL4.

By contrast, according to some embodiments, the bit lines BL1-BL4 may be connected to the auxiliary lines SBL1-SLB4 with different lengths, and this makes it possible to remove a difference in connection structure with the auxiliary lines. As a result, the bit lines BL1-BL4 may have electric characteristics similar to each other.

Example Embodiments

Figure 11A:
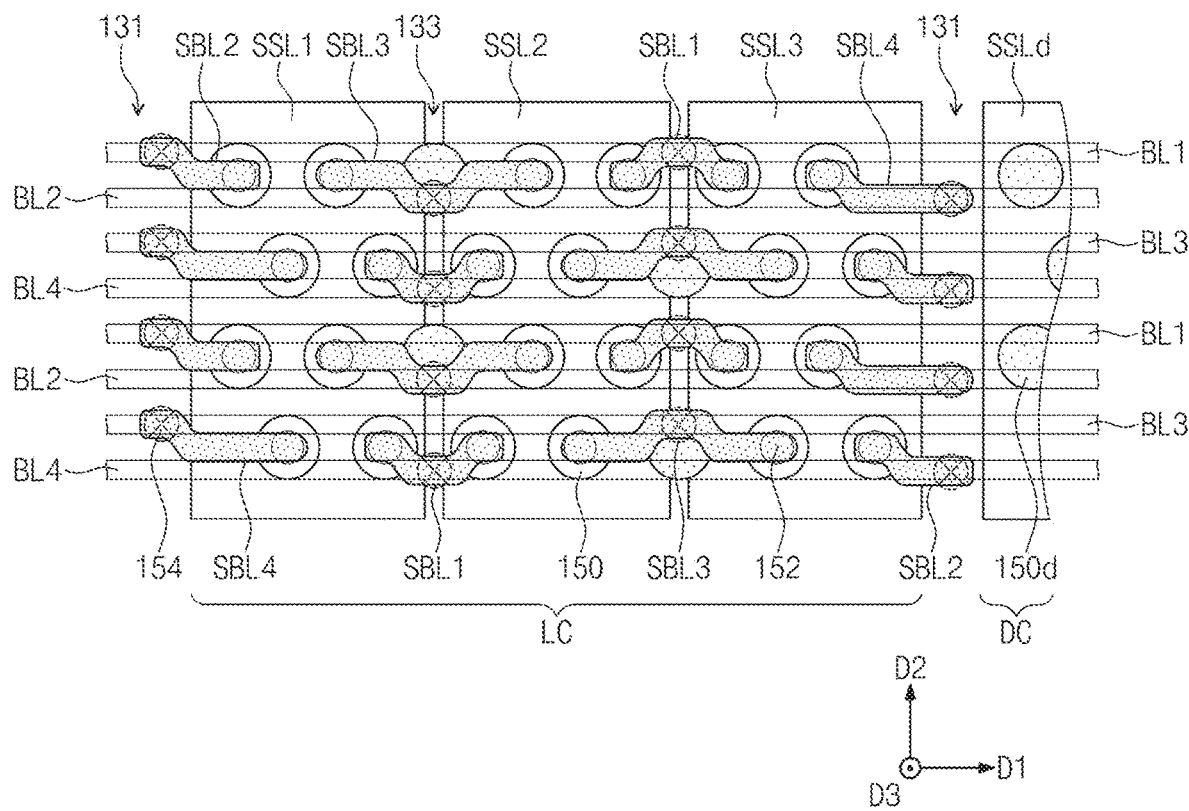
FIG. 11A is a plan view illustrating a semiconductor memory device according to some example embodiments of present inventive concepts.
Figure 11A:
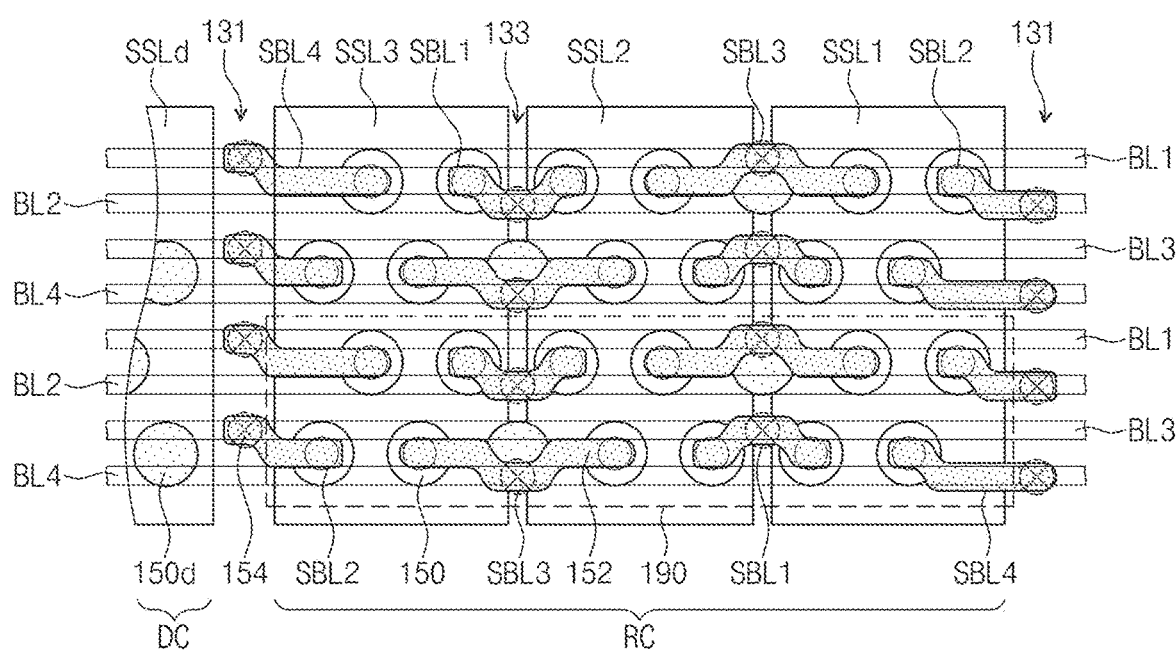

FIG. 11A is a plan view illustrating a semiconductor memory device according to example embodiments of present inventive concepts. The left and right cell regions are illustrated in upper and lower regions, respectively, of FIG. 11A. This is true for the following figures to be described below.

Referring to FIG. 11A, a semiconductor memory device 2a may have a cell array structure that is expanded in/toward at least the first direction D1, compared with the semiconductor memory device 1a of FIG. 2A. As an example, each of the left and right cell regions LC and RC may include first to third string selection lines SSL1-SSL3 that are separated from each other by a pair of the selection-line cut regions 133. The semiconductor memory device 2a may be configured to include a plurality of cell arrays 190, which are repeatedly disposed, and each of which has fourteen channels (e.g., twelve vertical channels 150 electrically connected to the bit lines BL1-BL4 and two dummy channels 150d).

The vertical and dummy channels 150 and 150d provided on the right and left cell regions RC and LC may be arranged to have a mirror image or symmetry with respect to the dummy cell region DC. Similarly, the lower contacts 152 provided on the right and left cell regions RC and LC may be arranged to have a mirror image or symmetry with respect to the dummy cell region DC.

The upper contacts 154 may be arranged spaced apart from each other by about twice the bit line pitch in the second direction D2 to form a column. The upper contacts 154 on the left cell region LC may be provided to have the same arrangement as that of the upper contacts 154 on the right cell region RC. In positions in the second direction D2, an adjacent pair of the upper contacts 154 may be shifted from each other by the bit line pitch in the second direction D2.

For example, the upper contacts 154, which are provided on the word-line cut region 131 and the selection-line cut region 133 at right and left sides of the left cell region LC, may be shifted from the upper contacts 154, which are provided on the word-line cut region 131 and the selection-line cut region 133 positioned at a left side of the left cell region LC, by the bit line pitch in the second direction D2.

In more detail, the upper contacts 154, which are positioned on the word-line cut region 131 and the selection-line cut region 133 at left and right sides of the left cell region LC, may be provided below the first bit line BL1 and the third bit line BL3. The upper contacts 154, which are positioned on the word-line cut region 131 and the selection-line cut region 133 at right and left sides, may be provided below the second bit line BL2 and the fourth bit line BL4. This may be true for the upper contacts 154 on the right cell region RC.

The auxiliary lines SBL1-SBL4 on the right cell region RC may have substantially the same planar shapes as those on the left cell region LC. The auxiliary lines SBL1-SLB4 on the right cell region RC may be arranged in such a way that they are shifted from the auxiliary lines SBL1-SBL4 on the left cell region LC, by about twice the bit line pitch in the second direction D2.

Unlike the semiconductor memory device 1a of FIG. 2A, in each of the left and right cell regions LC and RC, the first to fourth auxiliary lines SBL1-SLB4 may be arranged along the first direction D1 below the first and second bit lines BL1 and BL2. Similarly, the first to fourth auxiliary lines SBL1-SLB4 may be arranged along the first direction D1 below the third and fourth bit lines BL3 and BL4.

Each of the bit lines BL1-BL4 may be electrically connected to the auxiliary lines SBL1-SBL4 with different lengths. As an example, each of the first and fourth bit lines BL1 and BL4 may be connected to the first auxiliary line SBL1 and the second auxiliary line SBL2 on the left cell region LC and to the third auxiliary line SBL3 and the fourth auxiliary line SBL4 on the right cell region RC. Each of the second and third bit lines BL2 and BL3 may be connected to the third auxiliary line SBL3 and the fourth auxiliary line SBL4 on the left cell region LC and to the first auxiliary line SBL1 and the second auxiliary line SBL2 on the right cell region RC.

Like this, since there is no difference in connection structure between the bit lines BL1-BL4 and the auxiliary lines SBL1-SLB4, the bit lines BL1-BL4 can have substantially the same electric characteristics (e.g., in terms of loading capacitance and resistance).

Example Embodiments

Figure 11B:
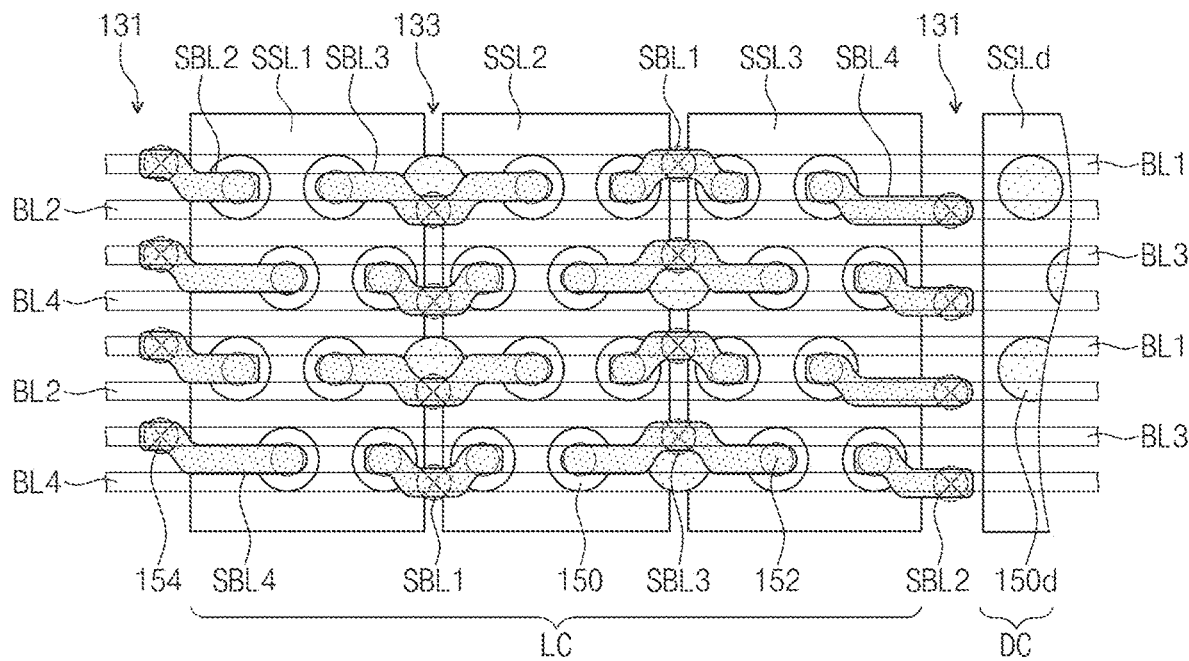
FIG. 11B is a plan view illustrating a modification of FIG. 11A.
Figure 11B:
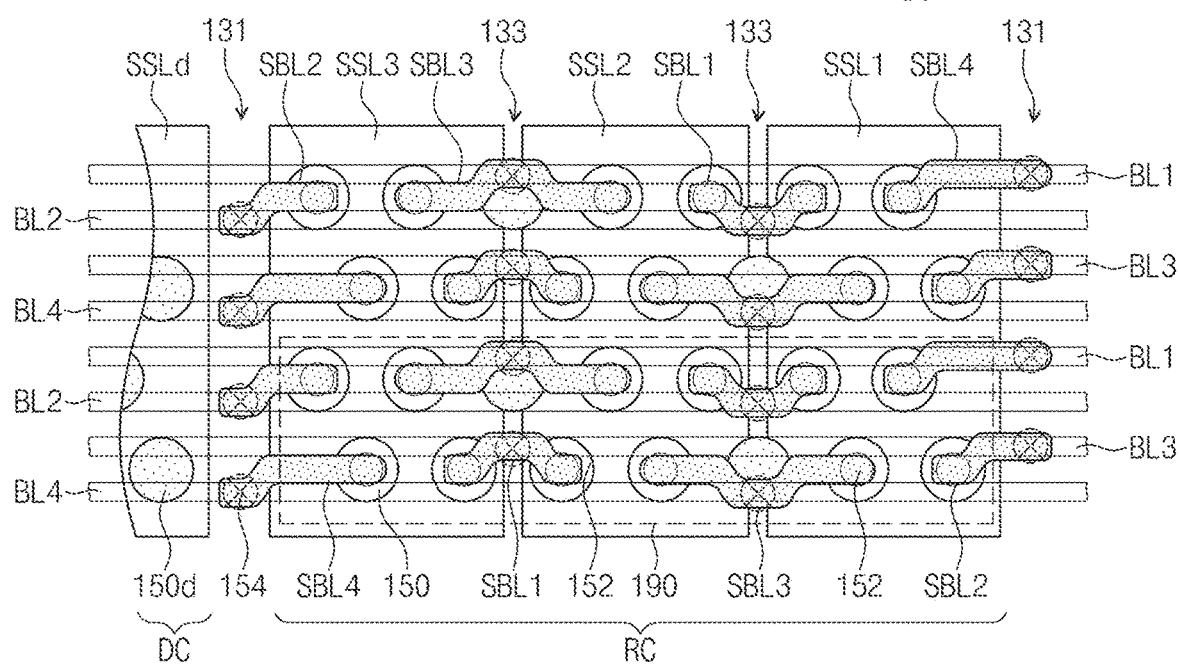

FIG. 11B is a plan view illustrating a modification of FIG. 11A.

Referring to FIG. 11B, a semiconductor memory device 2b may be configured to include a plurality of cell arrays 190, which are repeatedly provided, and each of which has 14 channels, similar to that of the semiconductor memory device 2a of FIG. 11A.

The vertical and dummy channels 150 and 150d on the right cell region RC may be provided to have substantially the same arrangement as those on the left cell region LC. Similarly, the lower contacts 152 on the right cell region RC may be provided to have substantially the same arrangement as those on the left cell region LC.

The upper contacts 154 on the left cell region LC may be provided to have substantially the same arrangement as the upper contacts 154 provided on the left cell region LC of FIG. 11A. The upper contacts 154 on the right cell region RC may be arranged in such a way that they are shifted from the upper contacts 154 on the left cell region LC, by the bit line pitch in the second direction D2.

For example, the upper contacts 154, which are positioned on the word-line cut region 131 and the selection-line cut region 133 at left and right sides of the left cell region LC, may be provided below the first bit line BL1 and the third bit line BL3. The upper contacts 154, which are positioned on the word-line cut region 131 and the selection-line cut region 133 at right and left sides, may be provided below the second bit line BL2 and the fourth bit line BL4.

Alternatively, the upper contacts 154, which are positioned on the word-line cut region 131 and the selection-line cut region 133 at left and right sides of the right cell region RC, may be provided below the second bit line BL2 and the fourth bit line BL4. The upper contacts 154, which are positioned on the word-line cut region 131 and the selection-line cut region 133 at right and left sides, may be provided below the first bit line BL1 and the third bit line BL3.

Planar shapes of the auxiliary lines SBL1-SBL4 provided on the right and left cell regions RC and LC may be arranged to have a mirror image or symmetry with respect to (e.g., across/about an axis in) the second direction D2.

In each of the left and right cell regions LC and RC, the first to fourth auxiliary lines SBL1-SLB4 may be arranged along the first direction D1 below the first and second bit lines BL1 and BL2. Similarly, the first to fourth auxiliary lines SBL1-SLB4 may be arranged along the first direction D1 below the third and fourth bit lines BL3 and BL4.

Each of the bit lines BL1-BL4 may be electrically connected to the auxiliary lines SBL1-SBL4 with different lengths. As an example, each of the first and fourth bit lines BL1 and BL4 may be connected to the first auxiliary line SBL1 and the second auxiliary line SBL2 on the left cell region LC and to the third auxiliary line SBL3 and the fourth auxiliary line SBL4 on the right cell region RC. Each of the second and third bit lines BL2 and BL3 may be connected to the third auxiliary line SBL3 and the fourth auxiliary line SBL4 on the left cell region LC and to the first auxiliary line SBL1 and the second auxiliary line SBL2 on the right cell region RC.

Like this, since there is no difference in connection structure between the bit lines BL1-BL4 and the auxiliary lines SBL1-SLB4, the bit lines BL1-BL4 can have substantially the same electric characteristics (e.g., in terms of loading capacitance and resistance).

Example Embodiments

Figure 12A:
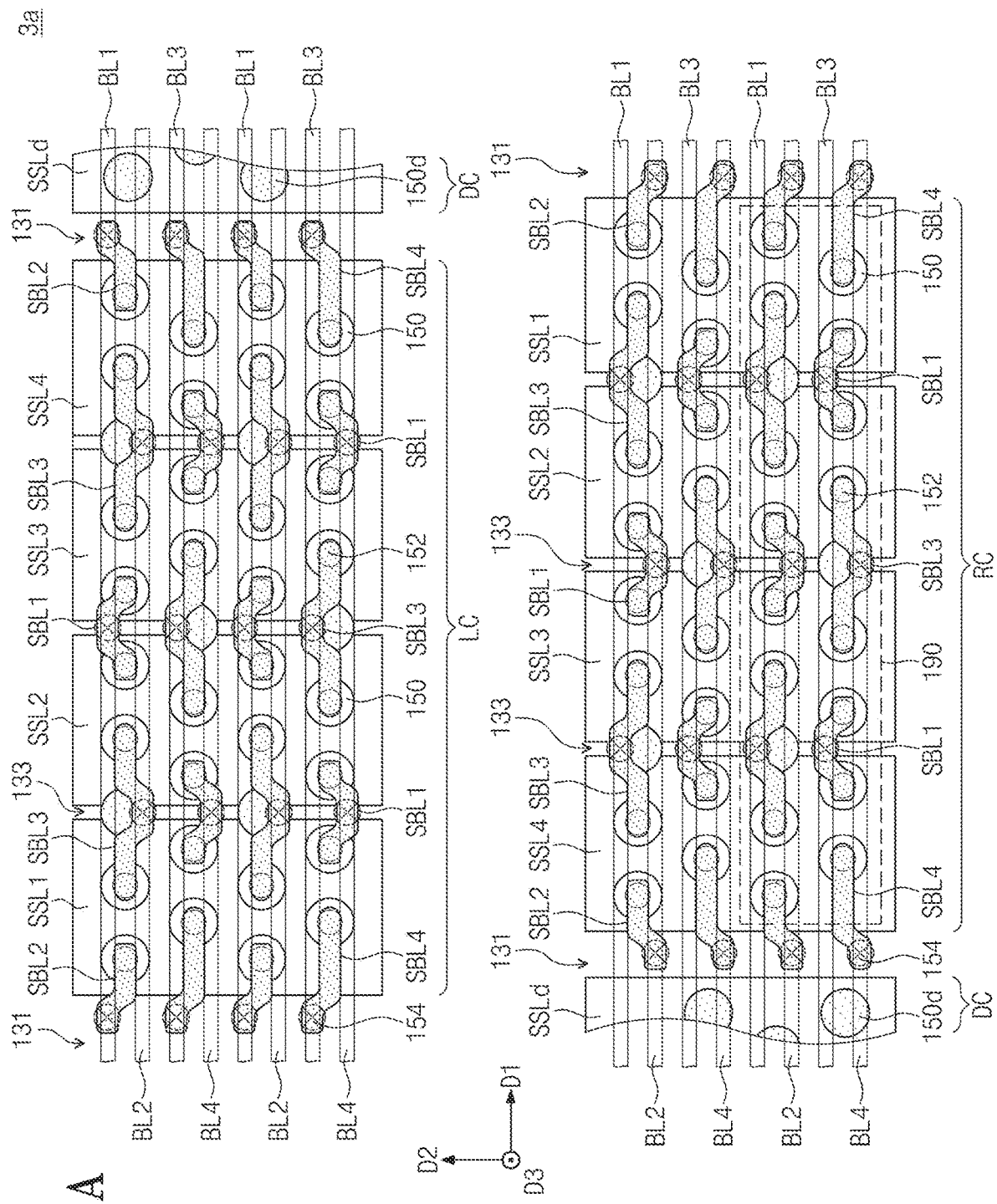
FIG. 12A is a plan view illustrating a semiconductor memory device according to some example embodiments of present inventive concepts.

FIG. 12A is a plan view illustrating a semiconductor memory device according to example embodiments of present inventive concepts.

Referring to FIG. 12A, a semiconductor memory device 3a may have a cell array structure that is expanded in/toward at least the first direction D1, compared with the semiconductor memory device 1a of FIG. 2A. As an example, each of the left and right cell regions LC and RC may include first to fourth string selection lines SSL1-SSL4 that are separated from each other by three selection-line cut regions 133. The semiconductor memory device 3a may be configured to include a plurality of cell arrays 190, which are repeatedly disposed, and each of which has nineteen channels (e.g., sixteen vertical channels 150 electrically connected to the bit lines BL1-BL4 and three dummy channels 150d).

The vertical and dummy channels 150 and 150d provided on the right and left cell regions RC and LC may be arranged to have a mirror image or symmetry with respect to the dummy cell region DC. Similarly, the lower contacts 152 provided on the right and left cell regions RC and LC may be arranged to have a mirror image or symmetry with respect to the dummy cell region DC.

The upper contacts 154 on the right cell region RC may be arranged in such a way that they are shifted from the upper contacts 154 on the left cell region LC, by the bit line pitch in the second direction D2.

For example, the upper contacts 154, which are provided on the word-line cut regions 131 at both sides of the left cell region LC and on the selection-line cut region 133 at a center of the left cell region LC, may be provided below the first bit line BL1 and the third bit line BL3. The upper contacts 154, which are provided on left and right selection-line cut regions 133 adjacent to the word-line cut regions 131, may be provided below the second bit line BL2 and the fourth bit line BL4.

Alternatively, the upper contacts 154, which are provided on the word-line cut regions 131 positioned at both sides of the right cell region RC and on the selection-line cut region 133 at a center of the right cell region RC, may be provided below the second bit line BL2 and the fourth bit line BL4. The upper contacts 154, which are provided on left and right selection-line cut regions 133 adjacent to the word-line cut regions 131, may be provided below the first bit line BL1 and the third bit line BL3.

Planar shapes of the auxiliary lines SBL1-SBL4 provided on the right and left cell regions RC and LC may be arranged to have a mirror image or symmetry with respect to the second direction D2.

Each of the bit lines BL1-BL4 may be electrically connected to the auxiliary lines SBL1-SBL4 with different lengths. As an example, the first bit line BL1 may be connected to the second auxiliary line SBL2 and the first auxiliary line SBL1 on the left cell region LC and to the third auxiliary line SBL3 on the right cell region RC. The second bit line BL2 may be connected to the third auxiliary line SBL3 on the left cell region LC and to the second auxiliary line SBL2 and the first auxiliary line SBL1 on the right cell region RC. The third bit line BL3 may be connected to the fourth auxiliary line SBL4 and the third auxiliary line SBL3 on the left cell region LC and to the first auxiliary line SBL1 on the right cell region RC. The fourth bit line BL4 may be connected to the first auxiliary line SBL1 on the left cell region LC and to the fourth auxiliary line SBL4 and the third auxiliary line SBL3 on the right cell region RC.

The first and second bit lines BL1 and BL2 may have substantially the same connection structure, and the third and fourth bit lines BL3 and BL4 may have substantially the same connection structure. In addition, a total length (e.g., 5+6=11) of the first to third auxiliary lines SBL1-SBL3 connected to the first bit line BL1 may be substantially equal or similar to a total length (e.g., 2+11=13) of the first, third, and fourth auxiliary lines SBL1, SLB3, and SLB4 connected to the fourth bit line BL4. A total length (e.g., 5+6=11) of the first to third auxiliary lines SBL1-SLB3 connected to the second bit line BL2 may be substantially equal or similar to a total length (e.g., 2+11=13) of the first, third and fourth auxiliary lines SBL1, SLB3, and SLB4 connected to the third bit line BL3 adjacent to the second bit line BL2. In the case where, as described above, the bit lines BL1-BL4 are provided to have substantially the same connection structure and the auxiliary lines SBL1-SBL4 are provided to have substantially the same length, it is possible for the bit lines BL1-BL4 to have substantially the same electric characteristics.

Example Embodiments

Figure 12B:
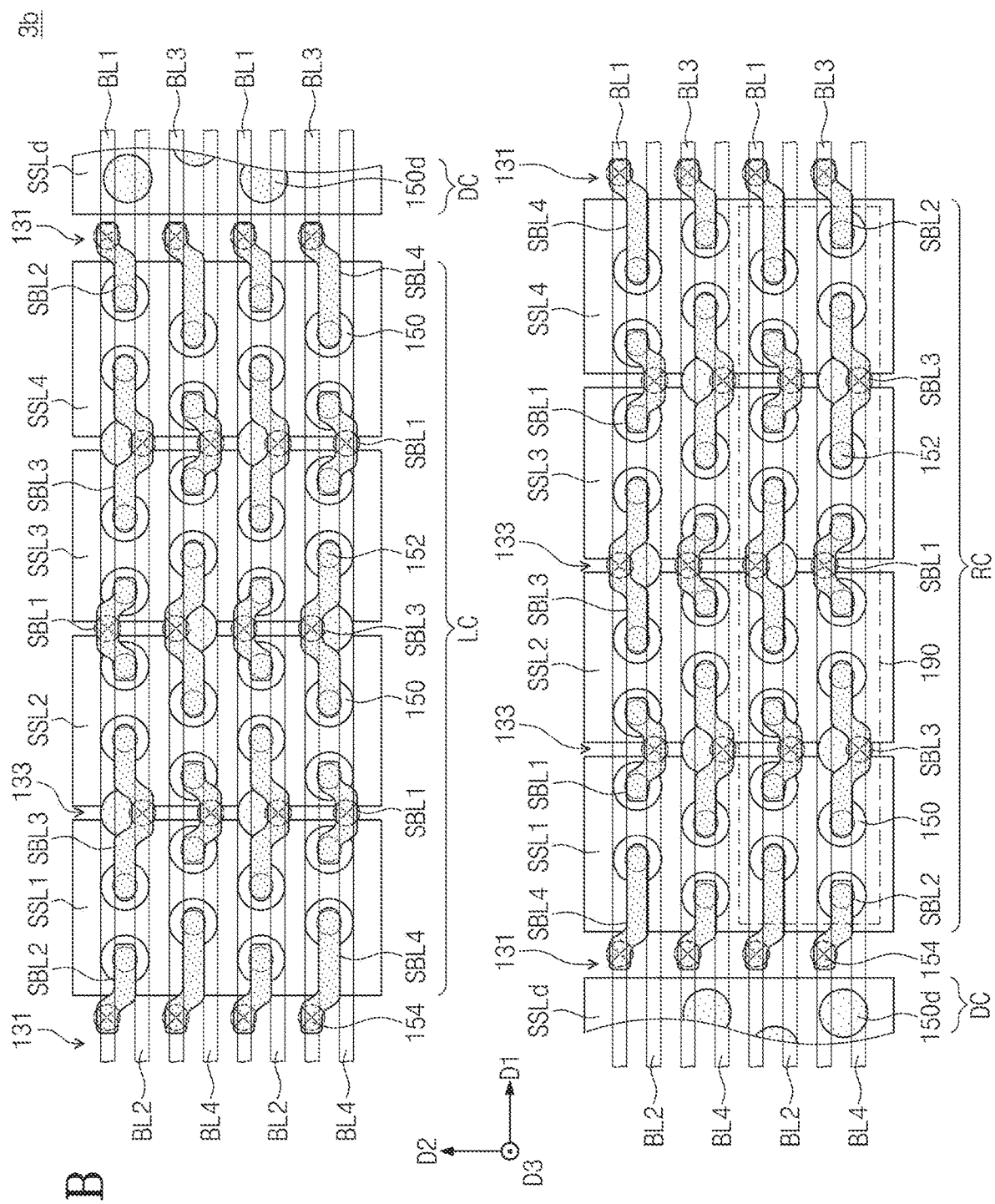
FIG. 12B is a plan view illustrating a modification of FIG. 12A.

FIG. 12B is a plan view illustrating a modification of FIG. 12A.

Referring to FIG. 12B, a semiconductor memory device 3b may be configured to include a plurality of cell arrays 190, which are repeatedly disposed, and each of which has 19 channels (e.g., sixteen vertical channels 150 and three dummy channels 150d), and in this sense, the semiconductor memory device 3b may be similar or identical to the semiconductor memory device 3a of FIG. 12A.

The vertical and dummy channels 150 and 150d on the right cell region RC may be provided to have substantially the same arrangement as those on the left cell region LC. Similarly, the lower contacts 152 on the right cell region RC may be provided to have substantially the same arrangement as those on the left cell region LC. This may be true for the upper contacts 154.

Each of the bit lines BL1-BL4 may be electrically connected to the auxiliary lines SBL1-SBL4 with different lengths. As an example, the first bit line BL1 may be connected to the second auxiliary line SBL2 and the first auxiliary line SBL1 on the left cell region LC and to the third auxiliary line SBL3 and the fourth auxiliary line SBL4 on the right cell region RC. The second bit line BL2 may be connected to the third auxiliary line SBL3 on the left cell region LC and to the first auxiliary line SBL1 on the right cell region RC. The third bit line BL3 may be connected to the fourth auxiliary line SBL4 and the third auxiliary line SBL3 on the left cell region LC and to the second auxiliary line SBL2 and the first auxiliary line SBL1 on the right cell region RC. The fourth bit line BL4 may be connected to the first auxiliary line SBL1 on the left cell region LC and to the third auxiliary line SBL3 on the right cell region RC.

The first bit line BL1 may have substantially the same connection structure as that of the third bit line BL3, and the second bit line BL2 may have substantially the same connection structure as that of the fourth bit line BL4. In addition, a total length (e.g., 5+11=16) of the first to fourth auxiliary lines SBL1-SBL4 connected to the first bit line BL1 may be different from a total length (e.g., 2+6=8) of the first and third auxiliary lines SBL1 and SLB3 connected to the fourth bit line BL4 adjacent to the first bit line BL1. A total length (e.g., 6+2=8) of the first and third auxiliary lines SBL1 and SBL3 connected to the second bit line BL2 may be different from a total length (e.g., 11+6=15) of the first to the fourth auxiliary lines SBL1-SBL4 connected to the third bit line BL3 adjacent to the second bit line BL2. However, as described previously with reference to FIGS. 10A through 10C, it is possible for the bit lines BL1-BL4 according to some embodiments to have relatively excellent electric characteristics, when compared with the case that bit lines are connected to auxiliary lines with substantially the same length.

Example Embodiments

Figure 13A:
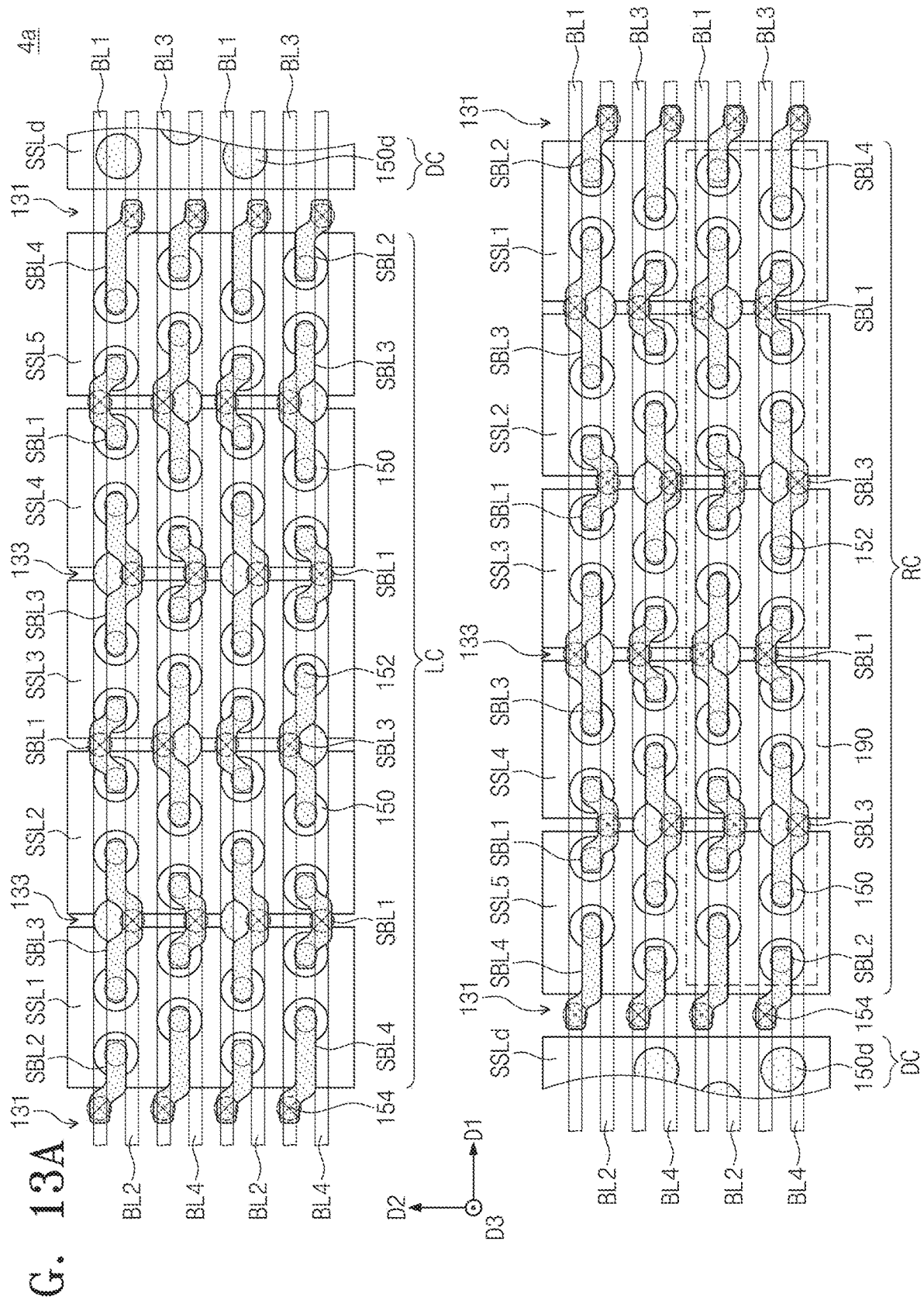
FIG. 13A is a plan view illustrating a semiconductor memory device according to some example embodiments of present inventive concepts.

FIG. 13A is a plan view illustrating a semiconductor memory device according to example embodiments of present inventive concepts.

Referring to FIG. 13A, a semiconductor memory device 4a may have a cell array structure that is expanded in/toward at least the first direction D1, compared with the semiconductor memory device 1a of FIG. 2A. As an example, each of the left and right cell regions LC and RC may include first to fifth string selection lines SSL1-SSL5 that are separated from each other by four selection-line cut regions 133. The semiconductor memory device 4a may be configured to include a plurality of cell arrays 190, which are repeatedly disposed, and each of which has twenty four channels (e.g., twenty vertical channels 150 electrically connected to the bit lines BL1-BL4 and four dummy channels 150d).

The vertical and dummy channels 150 and 150d provided on the right and left cell regions RC and LC may be arranged to have a mirror image or symmetry with respect to the dummy cell region DC. Similarly, the lower contacts 152 provided on the right and left cell regions RC and LC may be arranged to have a mirror image or symmetry with respect to the dummy cell region DC.

The upper contacts 154 on the right cell region RC may be provided to have substantially the same arrangement as those on the left cell region LC. For example, the upper contacts 154 may have substantially the same arrangement as those of the semiconductor memory device 2a of FIG. 11A.

The auxiliary lines SBL1-SBL4 on the left cell region LC may have substantially the same planar shapes as those on the right cell region RC.

Each of the bit lines BL1-BL4 may be electrically connected to the auxiliary lines SBL1-SBL4 with different lengths. As an example, each of the first and fourth bit lines BL1 and BL4 may be connected to the first auxiliary line SBL1 and the second auxiliary line SBL2 on the left cell region LC and to the third auxiliary line SBL3 and the fourth auxiliary line SBL4 on the right cell region RC. The second and third bit lines BL2 and BL3 may be connected to the third auxiliary line SBL3 and the fourth auxiliary line SBL4 on the left cell region LC and to the first auxiliary line SBL1 and the second auxiliary line SBL2 on the right cell region RC. Like this, since there is no difference in connection structure between the bit lines BL1-BL4 and the auxiliary lines SBL1-SLB4, the bit lines BL1-BL4 can have substantially the same electric characteristics (e.g., in terms of loading capacitance and resistance).

Example Embodiments

Figure 13B:
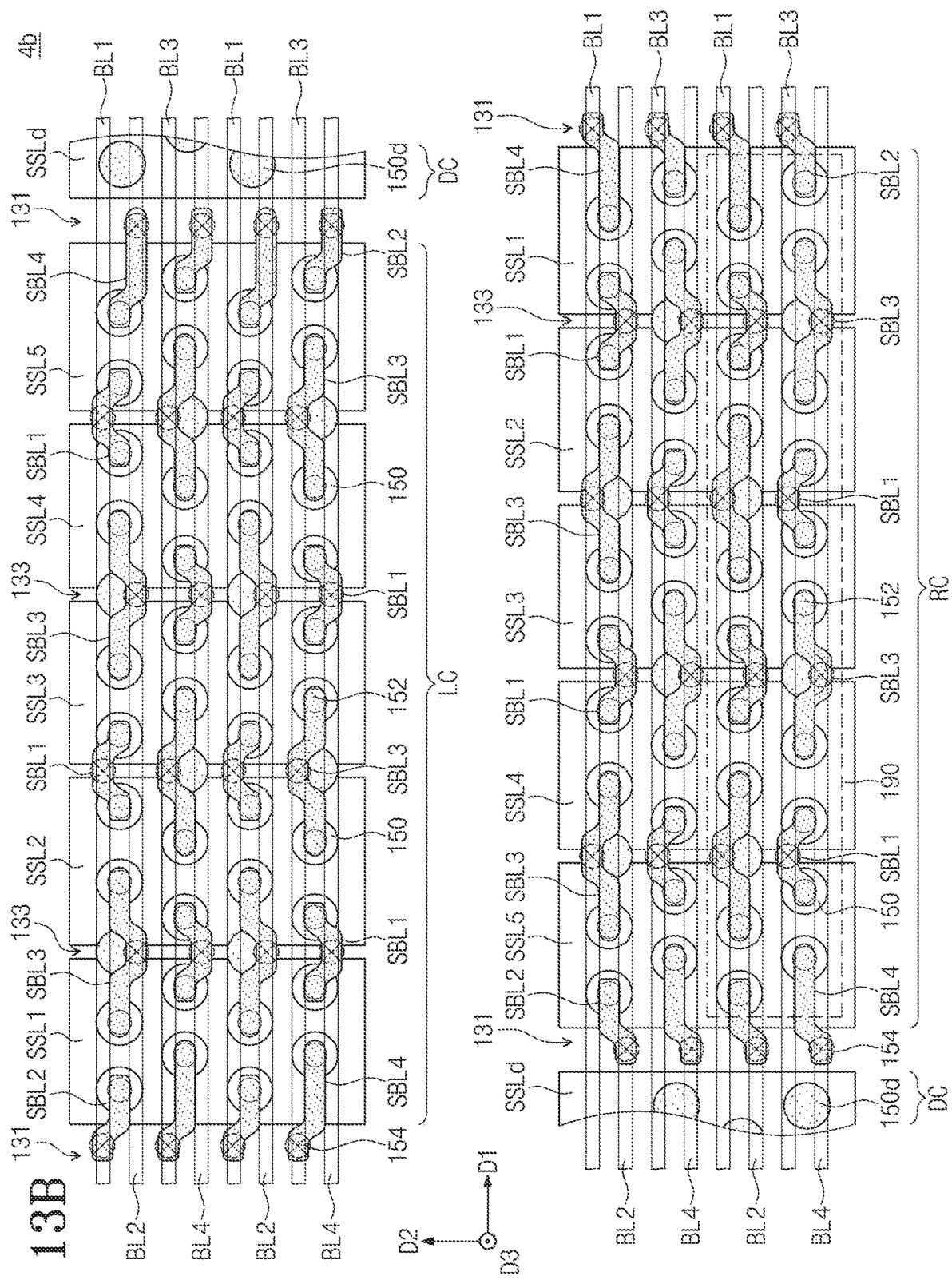
FIG. 13B is a plan view illustrating a modification of FIG. 13A.

FIG. 13B is a plan view illustrating a modification of FIG. 13A.

Referring to FIG. 13B, a semiconductor memory device 4*b* may be configured to include a plurality of cell arrays 190, which are repeatedly provided, and each of which has 24 channels, similar to that of the semiconductor memory device 4*a* of FIG. 13A.

The vertical and dummy channels 150 and 150*d* on the right cell region RC may be provided to have substantially the same arrangement as those on the left cell region LC. Similarly, the lower contacts 152 on the right cell region RC may be provided to have substantially the same arrangement as those on the left cell region LC. The upper contacts 154 provided on the right and left cell regions RC and LC may be arranged to have a mirror image or symmetry with respect to the dummy cell region DC.

Planar shapes of the auxiliary lines SBL1-SBL4 provided on the right and left cell regions RC and LC may be arranged to have a mirror image or symmetry with respect to the second direction D2.

Each of the bit lines BL1-BL4 may be electrically connected to the auxiliary lines SBL1-SBL4 with different lengths. As an example, each of the first and fourth bit lines BL1 and BL4 may be connected to the first auxiliary line SBL1 and the second auxiliary line SBL2 on the left cell region LC and to the third auxiliary line SBL3 and the fourth auxiliary line SBL4 on the right cell region RC. The second and third bit lines BL2 and BL3 may be connected to the third auxiliary line SBL3 and the fourth auxiliary line SBL4 on the left cell region LC and to the first auxiliary line SBL1 and the second auxiliary line SBL2 on the right cell region RC. Since there is no difference in connection structure between the bit lines BL1-BL4 and the auxiliary lines SBL1-SLB4, the bit lines BL1-BL4 can have substantially the same electric characteristics (e.g., in terms of loading capacitance and resistance).

[Application]

Figure 14A:
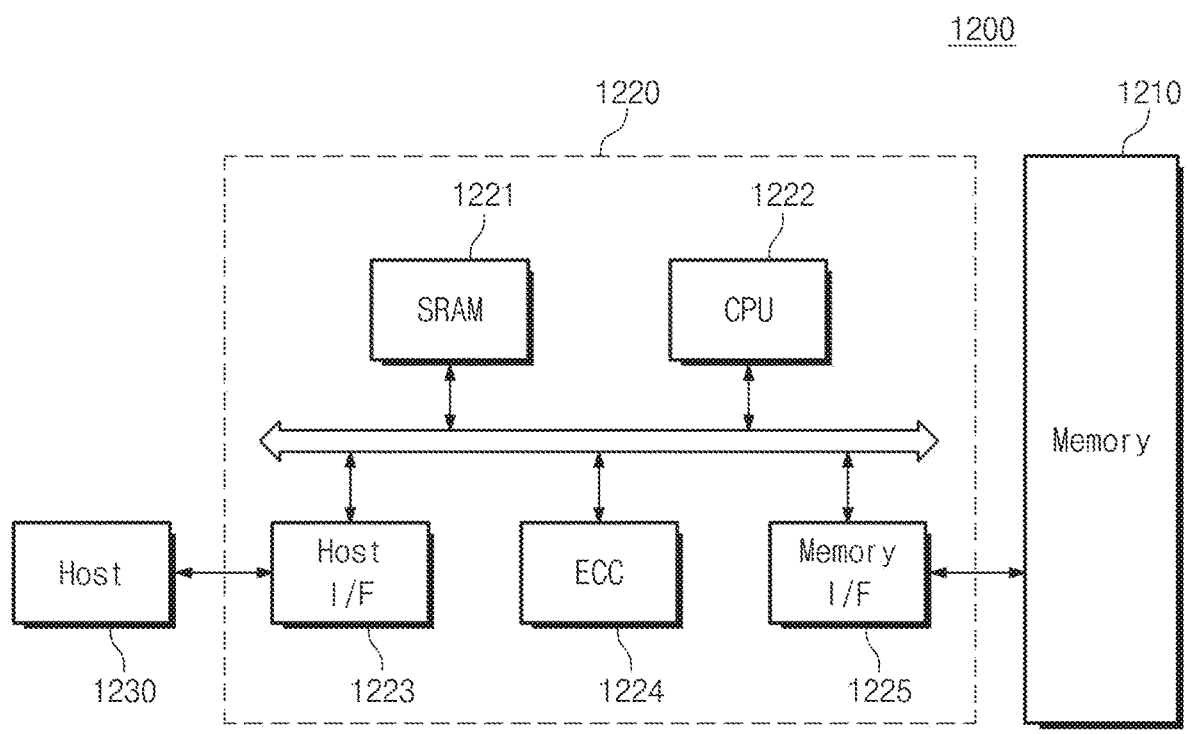
FIG. 14A is a block diagram illustrating an example of a memory card including a semiconductor memory device according to example embodiments of present inventive concepts.
Figure 14B:
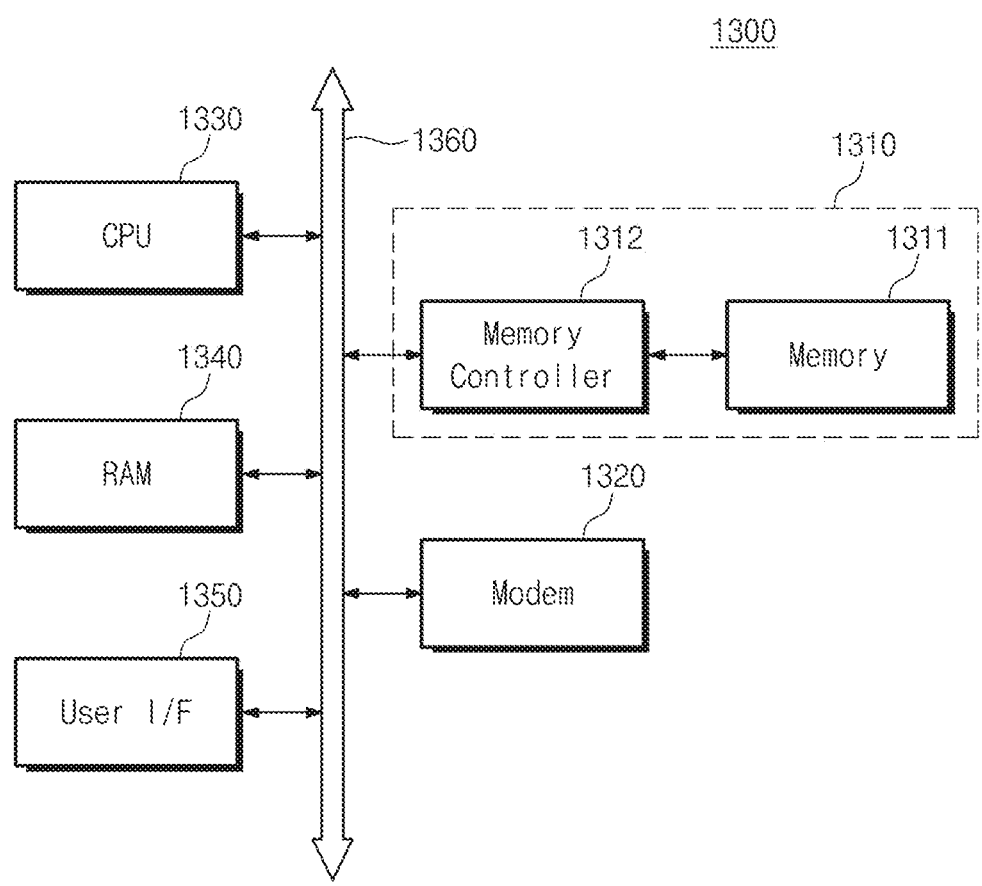
FIG. 14B is a block diagram illustrating an example of an information processing system including a semiconductor memory device according to example embodiments of present inventive concepts.

FIG. 14A is a block diagram illustrating an example of a memory card including a semiconductor memory device according to example embodiments of present inventive concepts. FIG. 14B is a block diagram illustrating an example of an information processing system including a semiconductor memory device according to example embodiments of present inventive concepts.

Referring to FIG. 14A, a memory card 1200 may include a memory device 1210, which may be or include at least one of the semiconductor memory devices according to example embodiments of present inventive concepts. As an example, the memory card 1200 may include a memory controller 1220 controlling general data exchanges between a host 1230 and the memory device 1210. A static random access memory (SRAM) 1221 may be used as an operating memory of a processing unit (e.g., a CPU 1222). A host interface (I/F) 1223 may include a data exchange protocol of the host 1230 connected to the memory card 1200. An error correction code block (e.g., an ECC 1224) may detect and correct errors included in data read from the memory device 1210. A memory interface (I/F) 1225 may interface with the memory device 1210. The processing unit 1222 may perform general control operations for data exchange of the memory controller 1220.

Referring to FIG. 14B, an information processing system 1300 may include a memory system 1310, which may be or include at least one of the semiconductor memory devices according to example embodiments of present inventive concepts is provided. For instance, the information processing system 1300 may be or include a mobile device and/or a desktop computer. The information processing system 1300 may further include a modem 1320, a central processing unit (CPU) 1330, a random access memory (RAM) 1340, and a user interface 1350, which may be electrically connected to the memory system 1310 through a system bus 1360. The memory system 1310 may include a memory device 1311 and a memory controller 1312, and in some embodiments, the memory system 1310 may be configured substantially identical to the memory card 1200 described with respect to FIG. 14A.

Data processed by the central processing unit 1330 and/or input from the outside (e.g., from a device/component external to the system 1300) may be stored in the memory system 1310. The information processing system 1300 may be configured to serve as one of memory cards, solid state drives (SSDs), camera image sensors, application chipsets, or the like. As an example, the memory system 1310 may be used as a portion of a solid state drive (SSD), and in this case, the information processing system 1300 may stably and reliably store a large amount of data in the memory system 1310.

According to example embodiments of present inventive concepts, because different auxiliary lines connected to each of the bit lines have at least two different lengths, it is possible to remove or reduce a variation in electric characteristics (e.g., load capacitance or resistance) of the bit lines. Accordingly, the semiconductor memory device can have improved electric characteristics.

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:

1. A semiconductor device comprising:
   a substrate;
   a first stack including first gate electrodes on the substrate;
   a first vertical channel, a second vertical channel, and a third vertical channel penetrating the first stack;
   a first auxiliary bit line connected to the first vertical channel on the first stack;
   a second auxiliary bit line connected to the second and third vertical channels on the first stack;
   a first bit line connected to the first auxiliary bit line; and
   a second bit line connected to the second auxiliary bit line,
   wherein, in a plan view, the first bit line and the second bit line are spaced apart from each other in a first direction.

2. The semiconductor device of claim 1, further comprising:
   a second stack including a second electrodes spaced apart from the first stack in a second direction crossing the first direction on the substrate;
   a fourth vertical channel, a fifth vertical channel, and a sixth vertical channel penetrating the second stack;

a third auxiliary bit line connected to the fourth vertical channel on the second stack; and a fourth auxiliary bit line connected to the fifth and sixth vertical channels on the second stack, wherein the first bit line is connected to the fourth auxiliary bit line, and wherein the second bit line is connected to the third auxiliary bit line.

3. The semiconductor device of claim 1, wherein a length of the first auxiliary bit line is longer than a length of the second auxiliary bit line.

4. The semiconductor device of claim 1, wherein a length of the first auxiliary bit line is shorter than a length of the second auxiliary bit line.

5. The semiconductor device of claim 1, further comprising:

a first upper contact between the first auxiliary bit line and the first bit line; and a second upper contact between the second auxiliary bit line and the second bit line, wherein, in the plan view, a center of the first vertical channel is spaced apart from the first bit line by a first distance, wherein the first bit line overlaps a center of the first upper contact, wherein, in the plan view, centers of the second and third vertical channels are spaced apart from the second bit line by a second distance, and wherein the second bit line overlaps a center of the second upper contact.

6. The semiconductor device of claim 1, wherein the first gate electrodes include a first string select electrode and a second string select electrode that are spaced apart from each other in a second direction crossing the first direction, wherein the first vertical channel penetrates the first string select electrode, wherein the second vertical channel penetrates the first string select electrode, and wherein the third vertical channel penetrates the second string select electrode.

7. The semiconductor device of claim 6, further comprising:

a fourth vertical channel penetrating the first stack and the second string select electrode, wherein the second vertical channel and the third vertical channel are between the first vertical channel and the fourth vertical channel; and a third auxiliary bit line connected to the fourth vertical channel on the first stack, wherein the first bit line is connected to the third auxiliary bit line.

8. The semiconductor device of claim 1, wherein the first vertical channel, the second vertical channel, and the third vertical channel are between the first bit line and the second bit line, wherein the first auxiliary bit line extends from a center of the first vertical channel to the first bit line, wherein the second auxiliary bit line extends from centers of the second and the third vertical channels to the second bit line, and wherein the semiconductor device further comprises:

a first upper contact between the first auxiliary bit line and the first bit line, and a second upper contact between the second auxiliary bit line and the second bit line.

9. The semiconductor device of claim 1, wherein the first gate electrodes include a first string select electrode and a second string select electrode that are spaced apart from each other in a second direction crossing the first direction, wherein the semiconductor device further comprises:

a first upper contact between the first auxiliary bit line and the first bit line;

a second upper contact between the second auxiliary bit line and second bit line;

a select line cut region between the first string select electrode and the second string select electrode; and a word line cut region at a side of the first stack on the substrate, wherein the first upper contact is on the word line cut region, and wherein the second upper contact is on the select line cut region.

10. The semiconductor device of claim 1, wherein the first gate electrodes include a first string select electrode and a second string select electrode that are spaced apart from each other in a second direction crossing the first direction, and wherein the semiconductor device further comprises:

a select line cut region between the first string select electrode and the second string select electrode; and dummy vertical channels arranged in the first direction along the select line cut region.

11. A semiconductor device comprising:

a substrate;

a first stack including gate electrodes on the substrate;

a first bit line and a second bit line intersecting the first stack and extending in a first direction, wherein the first bit line and the second bit line are spaced apart from each other in a second direction crossing the first direction;

a first vertical channel and a second vertical channel penetrating the first stack, wherein the first vertical channel and the second vertical channel are adjacent to each other in the first direction and are between the first bit line and the second bit line;

a first auxiliary bit line connected the first vertical channel on the first stack and extending from the first vertical channel to the first bit line;

a second auxiliary bit line connected the second vertical channel on the first stack and extending from the second vertical channel to the second bit line;

a first upper contact between the first auxiliary bit line and the first bit line; and a second upper contact between the second auxiliary bit line and the second bit line.

12. The semiconductor device of claim 11, further comprising:

a second stack including gate electrodes on the substrate, wherein the first stack and the second stack are spaced apart from each other in the first direction, and the first bit line and the second bit line extend on the second stack;

a third vertical channel and a fourth vertical channel penetrating the second stack, wherein the third vertical channel and the fourth vertical channel are adjacent to each other in the first direction and are between the first bit line and the second bit line;

a third auxiliary bit line connected the third vertical channel on the second stack and extending from the third vertical channel to the second bit line;

a fourth auxiliary bit line connected the fourth vertical channel on the second stack and extending from the fourth vertical channel to the first bit line;
a third upper contact between the third auxiliary bit line and the second bit line; and
a fourth upper contact between the fourth auxiliary bit line and the first bit line.

13. The semiconductor device of claim 11,
wherein the gate electrodes include a first string select line and a second string select line that are spaced apart from each other in the first direction,
wherein the semiconductor device further comprises:
 a word line cut region at one side of the first stack; and
 a select line cut region between the first string select line and the second string select line,
wherein the first upper contact is on an end of the first auxiliary bit line that is on the word line cut region,
wherein the second auxiliary bit line crosses the select line cut region, and
wherein the second upper contact is on a portion of the second auxiliary bit line that is on the select line cut region.

14. The semiconductor device of claim 11,
wherein the gate electrodes include a first string select line and a second string select line that are spaced apart from each other in the first direction,
wherein the first vertical channel and the second vertical channel penetrate the first string select line,
wherein the semiconductor device further comprises:
 a third vertical channel and a fourth vertical channel penetrating the second string select line and the first stack, wherein the third vertical channel and the fourth vertical channel are between the first bit line and the second bit line; and
 a third auxiliary bit line connected to the fourth vertical channel on the first stack and extending from the fourth vertical channel to the first bit line,
wherein the second vertical channel and the third vertical channel are adjacent to each other, and
wherein the second auxiliary bit line extends onto the third vertical channel.

15. The semiconductor device of claim 11, wherein a length of the first auxiliary bit line is different from a length of the second auxiliary bit line.

16. The semiconductor device of claim 11,
wherein, in a plan view, the first bit line and the second bit line overlap portions of the first vertical channel and the second vertical channel, and
wherein centers of the first vertical channel and the second vertical channel are between the first bit line and the second bit line.

17. A semiconductor device comprising:
a substrate;
a first stack including a first string select line and a second string select line spaced apart from each other in a first direction on the substrate;
a first select line cut region between the first string select line and the second string select line;
a first word line cut region at a first side of the first stack on the substrate;
a first vertical channel and a second vertical channel penetrating the first stack and the first string select line;
a first auxiliary bit line connected to the first vertical channel on the first stack;
a second auxiliary bit line connected to the second vertical channel on the first stack;
a first upper contact connected the first auxiliary bit line;
a second upper contact connected to the second auxiliary bit line;
a first bit line connected to the first upper contact; and
a second bit line connected to the second upper contact and spaced apart from the first bit line in a second direction crossing the first direction,
wherein the first upper contact is on the first word line cut region, and
wherein the second upper contact is on the first select line cut region.

18. The semiconductor device of claim 17, further comprising:
a second word line cut region at a second side opposite to the first side of the first stack on the substrate;
a third and a fourth vertical channels penetrating the first stack and the second string select line;
a third auxiliary bit line connected to the fourth vertical channel on the first stack; and
a third upper contact connected to the third auxiliary bit line on the second word line cut region,
wherein the third vertical channel is connected to the second bit line through the second auxiliary bit line, and
wherein the fourth vertical channel is connected to the first bit line through the third auxiliary bit line.

19. The semiconductor device of claim 17,
wherein the first bit line overlaps the first upper contact and is above the first vertical channel, and
wherein the second bit line overlaps the second upper contact and is above the second vertical channel.

20. The semiconductor device of claim 17, further comprising dummy vertical channels arranged along the first select line cut region in the second direction.

* * * * *